(12) United States Patent
Takahashi et al.

(10) Patent No.: US 6,888,206 B2
(45) Date of Patent: May 3, 2005

(54) POWER SEMICONDUCTOR DEVICE AND METHOD OF MANUFACTURING THE SAME

(75) Inventors: Tetsuo Takahashi, Tokyo (JP); Hideki Takahashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 305 days.

(21) Appl. No.: 10/300,812

(22) Filed: Nov. 21, 2002

(65) Prior Publication Data

US 2003/0218220 A1 Nov. 27, 2003

(30) Foreign Application Priority Data

May 27, 2002 (JP) ........................................ 2002-152090

(51) Int. Cl.[7] .............................................. H01L 29/72
(52) U.S. Cl. ........................ 257/407; 257/409; 257/412
(58) Field of Search ................................ 257/407, 409, 257/412

(56) References Cited

U.S. PATENT DOCUMENTS

| 5,945,692 A | 8/1999 | Yano et al. |
| 5,973,359 A | 10/1999 | Kobayashi et al. |
| 6,246,101 B1 | 6/2001 | Akiyama |

FOREIGN PATENT DOCUMENTS

| JP | 62-11272 | 1/1987 |
| JP | 7-326744 | 12/1995 |
| JP | 8-306911 | 11/1996 |
| JP | 9-186315 | 7/1997 |
| JP | 11-145466 | 5/1999 |
| JP | 2000-22163 | 1/2000 |
| JP | 2000-269520 | 9/2000 |
| JP | 2001-44431 | 2/2001 |
| JP | 2001-237437 | 8/2001 |

OTHER PUBLICATIONS

IBM Tech Disc Bul, #77044099, vol. 19, No. 11, pp. 4099–5000, Apr. 1977.*

* cited by examiner

Primary Examiner—Edward Wojciechowicz
(74) Attorney, Agent, or Firm—Oblon, Spivak, McClelland, Maier & Neustadt, P.C.

(57) ABSTRACT

An n-type substrate surface and a p+ region are provided adjacent to each other, on upper surfaces of which an insulation film, a shield and a conductor are formed in this order. The shield is connected to the conductor. The shield and the conductor are insulated from the n-type substrate surface by the insulation film. Even when polarization occurs in a mold provided over a semiconductor device due to a potential distribution along the substrate surface of the semiconductor device, the conductive shield can prevent the substrate from being affected by the polarization in the mold, allowing avoidance of an adverse influence of deterioration in breakdown voltage and the like.

26 Claims, 33 Drawing Sheets

F I G . 1
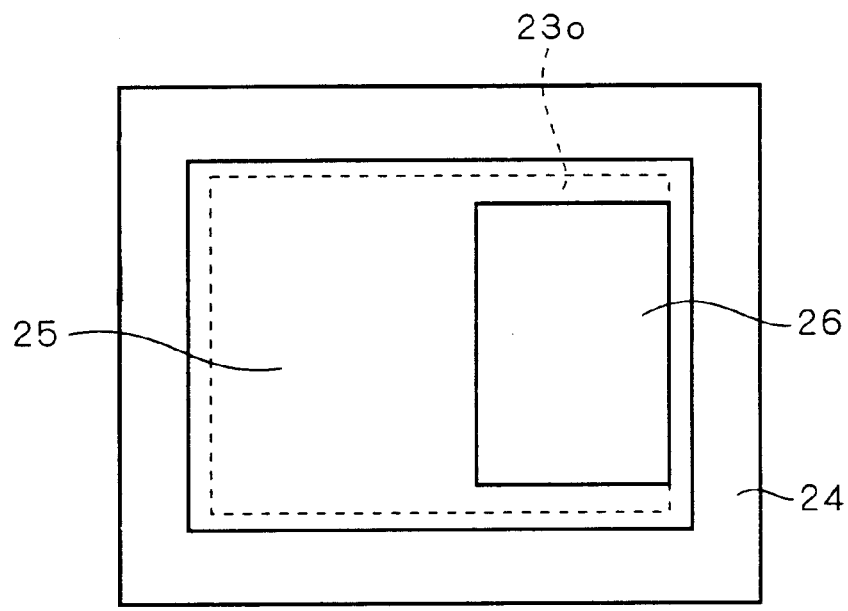
F I G . 2
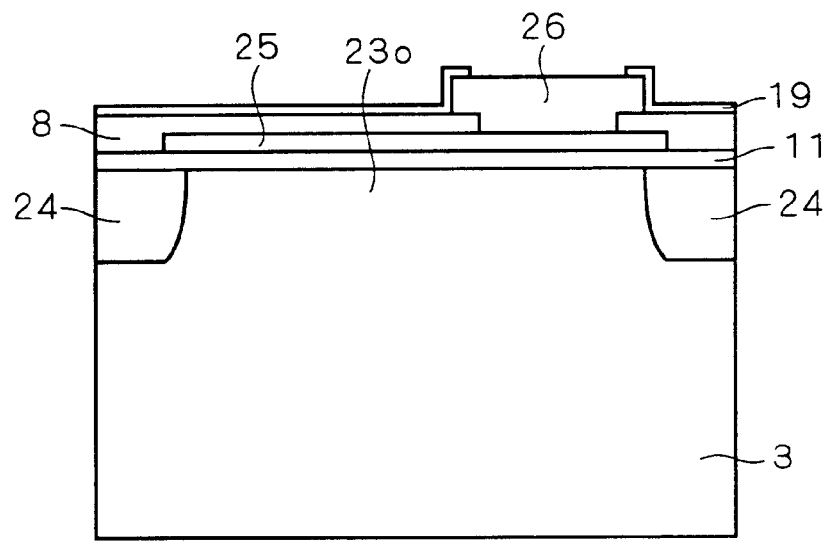

F I G . 5
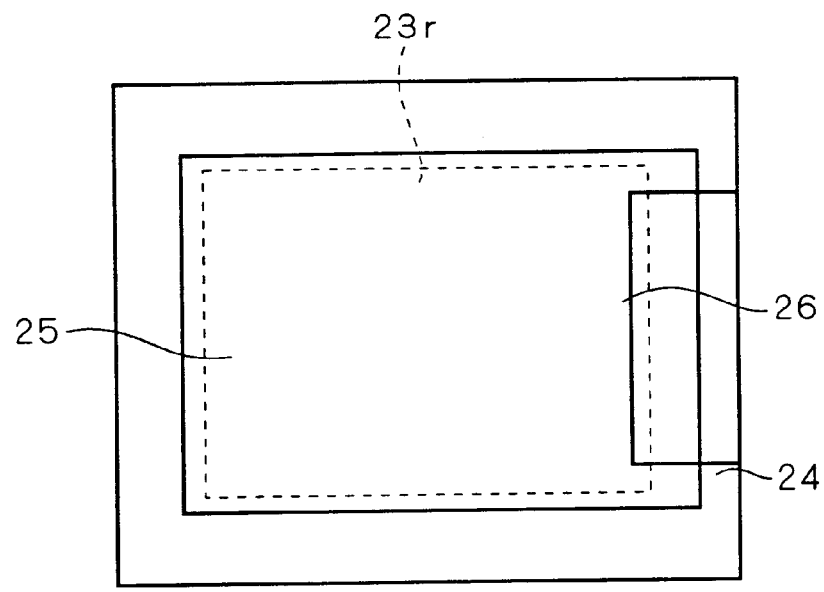
F I G . 6
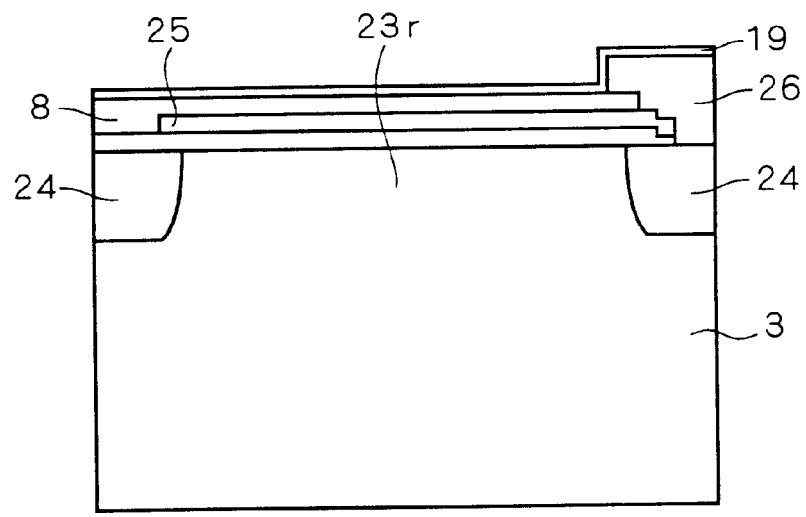

F I G . 7
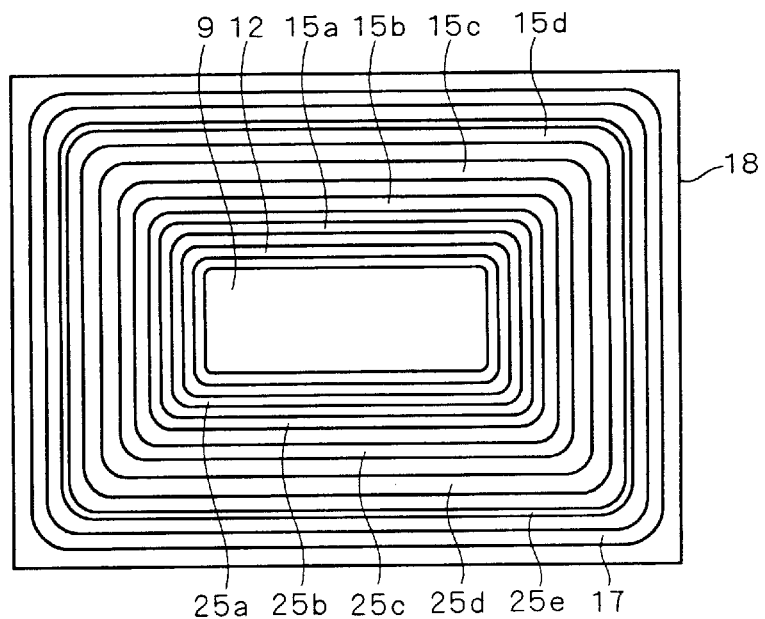
F I G . 8
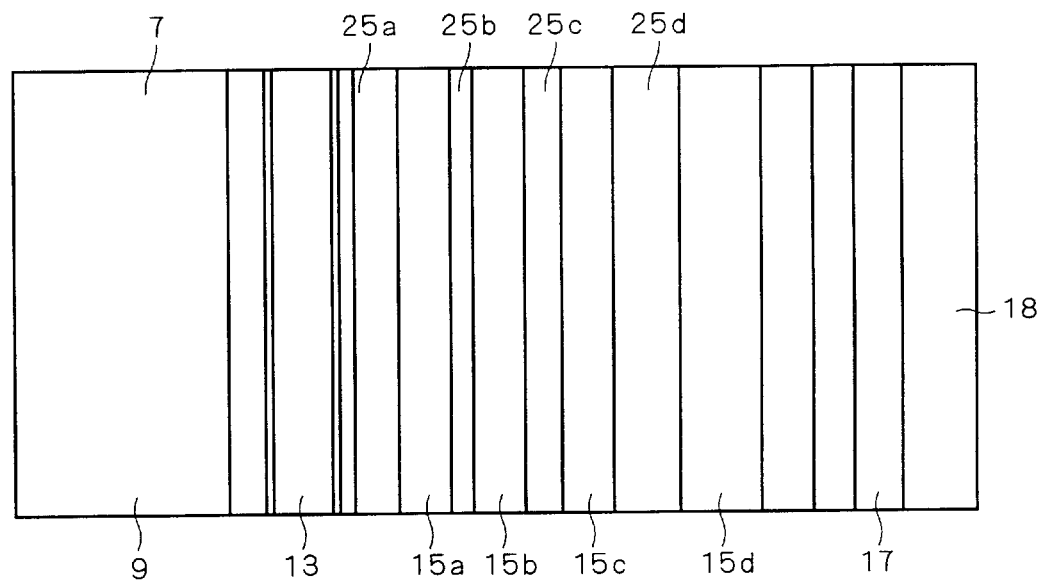

F I G . 3 5
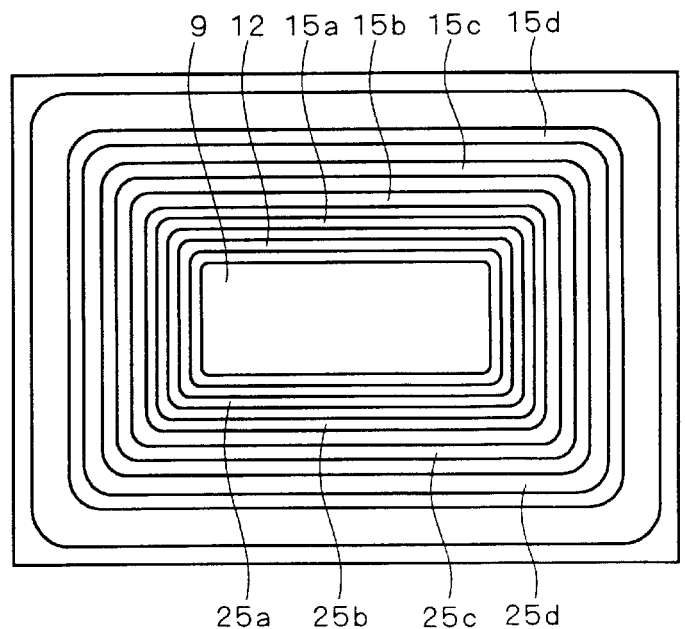
F I G . 3 6
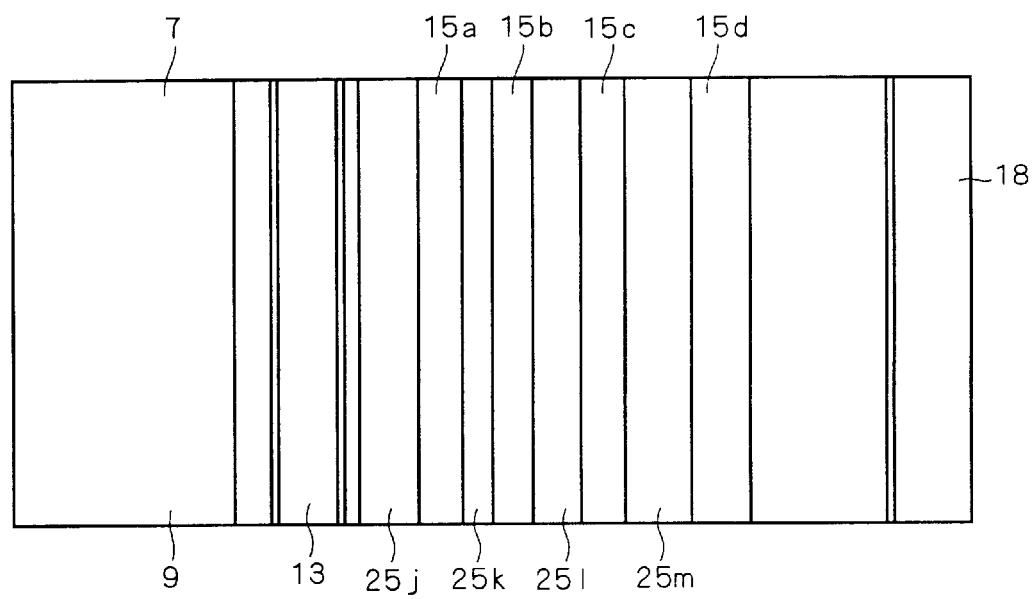

POWER SEMICONDUCTOR DEVICE AND METHOD OF MANUFACTURING THE SAME

BACKGROUND OF THE INVENTION

1. Field of the Invention

The present invention relates to a power semiconductor device having a potential difference along a substrate surface, and more particularly, to a power semiconductor device capable of preventing variations or deterioration in breakdown voltage and a technique related thereto.

2. Description of the Background Art

Power semiconductor devices are generally required to have the function of maintaining the resistance to a high voltage. Among power semiconductor devices having such function, those having the structure of guard rings arranged almost annularly around a certain device or that of a field plate are known as disclosed in Japanese Patent Application Laid-Open Nos. 11-145466 and 9-186315, for example.

FIG. 59 shows an example (First background art) in which the guard ring structure is applied to an IGBT (Insulated Gate Bipolar Transistor), and FIG. 60 shows an example (Second background art: e.g., Japanese Patent Application Laid-Open No. 7-326744) in which the field plate structure is applied to an IGBT. Elements having the same functions are designated by the same reference numerals in FIGS. 59 and 60.

FIG. 59 according to the first background art illustrates: a p+ collector 1; an n+ buffer layer 2; an n− drift layer (substrate) 3; a channel dope 4; an n+ emitter 5; a gate oxide film 6; a polysilicon gate electrode 7; an interlayer insulation film 8; an emitter electrode 9; a p+ isolation well 10; a field oxide film (insulation film) 11; a polysilicon gate electrode 12; a gate electrode 13; guard rings 14a to 14d for maintaining breakdown voltage arranged almost annularly around a transistor containing the channel dope 4, n+ emitter 5, gate oxide film 6, polysilicon gate electrode 7, interlayer insulation film 8, emitter electrode 9 and p+ isolation well 10; Al electrodes 15a to 15d for grounding the guard rings 14a to 14d; a channel stopper 16; a polysilicon plate 17; a channel stopper ground electrode 18; and a passivation film 19.

The guard ring structure according to the first background art shown in FIG. 59 is provided with the guard rings 14a to 14d to extend a depletion layer such that intensification of an electric field at an edge of the junction of the p+ isolation well 10 and the n− drift layer 3 does not cause deterioration in breakdown voltage, thereby maintaining breakdown voltage.

In the field plate structure according to the second background art shown in FIG. 60, a field plate 20 is appropriately set at a potential lower than that of the main surface of the n− drift layer 3 to extend a depletion layer so as to relax an electric field at the junction of the channel dope 4 and the n− drift layer 3, thereby maintaining breakdown voltage.

The aforementioned first background art has a disadvantage in that breakdown voltage deteriorates under the influence of a chip interface. When voltage is applied across the p+ collector 1 in the state that the upper surface of the chip is sealed with a transfer mold 21 as shown in FIG. 61, for example, movable charges inside the mold 21 causes polarization in the mold, generating negative polarization charges 22a on the side of the channel stopper 16 being almost equal in potential to the p+ collector 1 and positive polarization charges 22b on the emitter side. This affects regions 23a to 23c of low concentration of the substrate surface (i.e., part of the n− drift layer 3 interposed between the guard rings 14a to 14d, respectively), resulting in variations in breakdown voltage as a whole and, in a worse situation, resulting in surface inversion, which may cause significant deterioration in breakdown voltage.

The second background art also has a disadvantage in that mold polarization may affect a region between the polysilicon gate electrode 12 and the polysilicon plate 17, resulting in variations or deterioration in breakdown voltage.

A third background art has been proposed against the first background art shown in FIG. 59 and the second background art shown in FIG. 60, in which the use of a semi-insulation film as the passivation film 19 on the chip surface at the expense of insulation properties to some degree allows hopping conduction of charges inside the semi-insulation film with heat energy or the like, causing the polarization charges 22a and 22b in the mold 21 to be cancelled out by the charges inside the passivation film 19, which can reduce the influence exerted upon the surface of the n− drift layer 3.

In the third background art, however, the passivation film 19 is basically required to serve as an insulation film, imposing limitations on the conductivity of the semi-insulation film. This causes a disadvantage that the above-described cancel-out effect of charges in the passivation film 19 has limitations, producing little effect on strong polarization in the mold 21 over the passivation film 19. Of course, increasing the conductivity of the passivation film 19 improves the cancel-out effect of charges, which, however, disadvantageously increases leakage current.

Further, CVD nitride films generally known as semi-insulation films disadvantageously affect electric properties of polysilicon elements including polysilicon of low concentration. Generally, a nitride-film-based semi-insulation film is formed by CVD or the like, at which hydrogen is produced as a product of a chemical reaction in the film deposition. Hydrogen produced at this time passivates dangling bonds of the surface of polysilicon with voltage bias or the like, resulting in changes in electric properties of the polysilicon surface. The reason why such changes in electric properties of polysilicon surface have not become a serious problem in the field of power devices is that polysilicon devices have generally been used only for polysilicon devices of a greatly high concentration such as gate wiring and have had low sensitivity to variations in electric properties at the interface. However, recent power devices are being improved in integration of circuit elements for improved performance, increasing the necessity to achieve integration of polysilicon elements. Therefore, the problem of changes in electric properties of polysilicon surface is becoming evident.

Furthermore, the influence of polarization becomes significant in the structure having a high potential only in part of the outer peripheral portion as shown in FIGS. 62 to 65 as a fourth background art. FIG. 62 is a plane view of a power semiconductor device, and FIG. 63 is a partially enlarged plane view thereof. FIGS. 64 and 65 are cross-sectional views taken along the lines A—A and B—B of FIG. 62, respectively.

As shown in FIGS. 62 to 65, a polysilicon Zener diode 27 for overvoltage protection is provided between the channel stopper 16 serving as a collector and the gate electrode 12 and is connected to the gate electrode 12 at its inner periphery and to the channel stopper 16 at its outer periphery. When the influence of polarization in a mold (cf. 21 in FIG. 61) over the passivation film 19 is negligible, the guard rings 14a to 14d and the diode 27 are designed to be matched in potential, causing no deterioration in breakdown voltage at the guard rings 14a to 14d and the diode 27.

However, when polarization occurs in the mold 21 over the passivation film 19 as described above and the surface of the n– drift layer 3 is inverted, the potential distribution inside the n– drift layer 3 varies, causing the polysilicon gate electrode 12 and the polysilicon plate 17 to be unmatched in potential, which disadvantageously causes deterioration in breakdown voltage.

Further, since the polysilicon Zener diode 27 itself has a polysilicon region of low concentration, the use of a semi-insulation film for the passivation film 19 as in the third background art causes variations in breakdown voltage of the diode 27 itself.

SUMMARY OF THE INVENTION

An object of the present invention is to provide a power semiconductor device capable of effectively preventing deterioration in breakdown voltage, and a technique related thereto.

According to a first aspect of the present invention, a power semiconductor device includes an impurity substrate surface of low concentration having a first conductivity type, an impurity region of high concentration having a second conductivity type, a conductor and a conductive shield. The impurity substrate surface is formed in a predetermined region of a substrate surface. The impurity region is formed in the substrate surface adjacent to the impurity substrate surface. The conductor is formed over the substrate surface to be insulated from the impurity substrate surface. The conductive shield is formed to include at least part of a region over the impurity substrate surface other than a region where the conductor is formed and to include a region overlapping a boundary region between the impurity substrate surface and the impurity region. The conductive shield is formed over the impurity substrate surface and the impurity region with a predetermined insulation film interposed therebetween. At least part of the conductive shield is connected to the conductor.

Even when polarization occurs in a mold provided over the semiconductor device due to a potential distribution along the substrate surface of the semiconductor device, the conductive shield can prevent the substrate from being affected by the polarization in the mold, allowing avoidance of an adverse influence of deterioration in breakdown voltage and the like.

According to a second aspect of the present invention, a power semiconductor device includes a semiconductor element region including a first impurity region of high concentration having a second conductivity type, a second impurity region of high concentration having the first conductivity type, a floating electrode connected to the second impurity region, one or more third impurity regions of high concentration having the second conductivity type for maintaining breakdown voltage, a shielding electrode and at least one conductive shield. The semiconductor element region is formed in a substrate surface of a first conductivity type. The second impurity region is spaced from the semiconductor element region along the substrate surface. The one or more third impurity regions are formed in the substrate surface between the first and second impurity regions. The shielding electrode is connected to at least one of the one or more third impurity regions. The at least one conductive shield is formed over and in contact with at least one of: a region interposed between one of the one or more third impurity regions most adjacent to the semiconductor element region and the first impurity region; a region interposed between the one or more third impurity regions; and a region interposed between the second impurity region and one of the one or more third impurity regions most adjacent to the second impurity region. The at least one conductive shield includes regions overlapping boundary regions between the first impurity region, the second impurity region and the one or more third impurity regions, with a predetermined insulation film provided between the at least one conductive shield and at least one of the substrate surface, the first impurity region, the one or more third impurity regions and the second impurity region. The at least one conductive shield is connected to the shielding electrode.

Even when polarization occurs in a mold provided over the semiconductor device due to a potential distribution along the substrate surface of the semiconductor device, the conductive shield can prevent the substrate from being affected by the polarization in the mold, allowing avoidance of an adverse influence of deterioration in breakdown voltage and the like.

According to a third aspect of the present invention, a power semiconductor device includes an impurity substrate surface of low concentration having a first conductivity type, an impurity region of high concentration having a second conductivity type, an insulation film, a shield, a high-potential region and at least one slit region of high concentration having the second conductivity type. The impurity substrate surface is formed in a predetermined region of a substrate surface. The impurity region is formed in the substrate surface adjacent to the impurity substrate surface. The insulation film is formed on upper surfaces of the impurity substrate surface and the impurity region. The shield is formed on an upper surface of the insulation film, extending from a region over at least part of the impurity substrate surface to a region over a junction of the impurity substrate surface and the impurity region. The high-potential region is formed on part of an upper surface of the shield. The at least one slit region is formed in the substrate surface under the high-potential region to be spaced and electrically separated from a junction of the impurity substrate surface and the impurity region along the substrate surface.

An electric field is relaxed in the slit region, which can prevent the junction of the substrate surface and the impurity region from being easily broken down under the influence of the high-potential region over the insulation film.

According to a fourth aspect of the present invention, a power semiconductor device includes an impurity substrate surface of low concentration having a first conductivity type, a predetermined semiconductor element, a plurality of guard rings of almost annular shape serving as impurity regions of high concentration having a second conductivity type, an insulation film, a predetermined semiconductor member and a high-potential region. The impurity substrate surface is formed in a predetermined region of a substrate surface. The predetermined semiconductor element is formed in part of the substrate surface. The plurality of guard rings are formed intermittently along the substrate surface such that a potential gradient can be generated along the substrate surface and centered at the predetermined semiconductor element. The insulation film is formed on upper surfaces of the impurity substrate surface and the plurality of guard rings. The predetermined semiconductor member is formed on an upper surface of the insulation film, extending from a region over at least part of the impurity substrate surface to a region over a junction of the impurity substrate surface and the impurity region. The high-potential region is formed on part of an upper surface of the predetermined semiconductor member on an outer peripheral side with respect to an outermost one of the plurality of guard rings. In the power semiconductor device, when the insulation film has a thickness T, an outermost peripheral position of the outermost one of the plurality of guard rings is determined such that a difference between a potential in the outermost peripheral position and that of the high-potential region provided thereover is not greater than a value Vx obtained by the following equation:

$$Vx(V)=72.3 \times T(\mu m)+77.6.$$

Even when polarization occurs in a mold provided over the semiconductor device, a predetermined breakdown voltage can easily be maintained.

Preferably, in the power semiconductor device, the outermost peripheral position of the outermost one of the plurality of guard rings is determined such that the potential of the high-potential region provided over the outermost one of the plurality of guard rings is not greater than the value Vx.

Even when polarization occurs in a mold provided over the semiconductor device, the semiconductor device can easily be prevented from breaking down due to thermal runaway in a normal operation.

According to a fifth aspect of the present invention, a power semiconductor device includes a semiconductor element region including a first impurity region of high concentration having a second conductivity type, a second impurity region of high concentration having the first conductivity type, a floating electrode connected to the second impurity region and at least one conductive shield. The semiconductor element region is formed in a substrate surface of a first conductivity type. The second impurity region is spaced from the semiconductor element region along the substrate surface. The at least one conductive shield is formed over a region interposed between the first and second impurity regions and formed to include a region overlapping a boundary region between the first and second impurity regions in the substrate surface. The at least one conductive shield is formed over the substrate surface and the first and second impurity regions with a predetermined insulation film interposed therebetween and being connected to the floating electrode or the terminal.

Even when polarization occurs in a mold provided over the semiconductor device due to a potential distribution along the substrate surface of the semiconductor device, the conductive shield can prevent the substrate from being affected by the polarization in the mold, allowing avoidance of an adverse influence of deterioration in breakdown voltage and the like.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plane view showing a power semiconductor device according to a first preferred embodiment of the present invention;

FIG. 2 is a cross-sectional view showing the power semiconductor device according to the first preferred embodiment;

FIG. 5 is a plane view showing a power semiconductor device according to a third preferred embodiment of the present invention;

FIG. 6 is a cross-sectional view showing the power semiconductor device according to the third preferred embodiment;

FIG. 7 is a plane view showing a power semiconductor device according to a fourth preferred embodiment of the present invention;

FIG. 8 is a partially enlarged plane view showing the power semiconductor device according to the fourth preferred embodiment;

FIG. 35 is a plane view showing a power semiconductor device according to a thirteenth preferred embodiment of the present invention;

FIG. 36 is a partially enlarged plane view showing the power semiconductor device according to the thirteenth preferred embodiment;

DESCRIPTION OF THE PREFERRED EMBODIMENTS

<First Preferred Embodiment>

Figure 3:
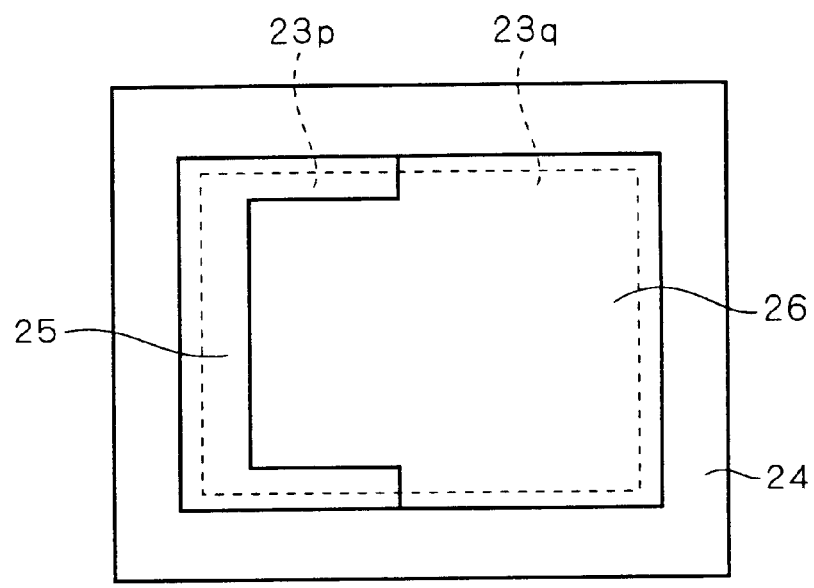
FIG. 3 is a plane view showing a power semiconductor device according to a second preferred embodiment of the present invention.

FIG. 1 is a plane view showing a power semiconductor device according to a first preferred embodiment of the present invention, and FIG. 2 is a cross-sectional view thereof. Elements having the same functions as those in the first to fourth background arts are designated by the same reference numerals in the present embodiment.

As shown in FIGS. 1 and 2, the power semiconductor device has an impurity region 24 of high concentration having a second conductivity type (p-type) formed on a peripheral portion of an impurity substrate surface 23o of low concentration having a first conductivity type (n-type) which is a surface of the n– drift layer 3 as a substrate of the first conductivity type. The field oxide film (insulation film) 11, a polysilicon shield 25 and a shielding Al electrode 26 are formed in this order on upper surfaces of the substrate surface 23o and the impurity region 24. The reference numerals 8 and 19 in FIG. 2 designate an interlayer insulation film and a passivation film for surface protection, respectively.

The polysilicon shield 25 is formed over the substrate surface 23o with the field oxide film 11 interposed therebetween such that its peripheral portion overlaps the boundary region between the impurity substrate surface 23o and the impurity region 24.

The polysilicon shield 25 is connected to the bottom of the shielding Al electrode 26 to be set at a predetermined potential. The potential of the Al electrode 26 is set at or below a threshold voltage of a MOS capacitor constituted of the three layers: polysilicon shield 25, field oxide film 11 and substrate surface 23o. Further, the polysilicon shield 25 is heavily doped to have a low resistance.

The polysilicon shield 25 covers the substrate surface 23o where surface inversion protection is required to be prevented. Thus, inversion and charge storage at the substrate surface 23o and the impurity region 24 are determined by the predetermined potential of the shield 25 as set and are not affected by polarization in the mold or the like.

The potential of the polysilicon shield 25 is set at such a level that the substrate surface 23o and the impurity region 24 are not inverted in voltage, thereby preventing without fail inversion at the substrate surface 23o and the impurity region 24.

Further, the polysilicon shield 25 is heavily doped so as not to have a potential gradient inside thereof, thereby preventing the potentials of the substrate surface 23o and the impurity region 24 from being affected by variations in external potential.

Next, a method of manufacturing the power semiconductor device will be described referring to the components shown in FIGS. 1 and 2.

For example, a method of manufacturing a power semiconductor device includes the steps of: forming the impurity substrate surface 23o of low concentration having a first conductivity type; forming the impurity region 24 of high concentration having a second conductivity type in the impurity substrate surface 23o; forming the insulation film 11 on upper surfaces of the impurity substrate surface and the impurity region; forming the conductive shield 25 on an upper surface of the insulation film over the impurity substrate surface to include a region overlapping a boundary region between the impurity substrate surface and the impurity region; and forming the conductor 26 to which at least part of the conductive shield is connected.

First, impurities of high concentration having the second conductivity type are selectively implanted into the periphery of the substrate 3 and are diffused to form the impurity region 24.

Next, the field oxide film 11 is formed by LOCOS (local oxidation of silicon).

Subsequently, polysilicon is deposited by CVD or the like, and selective etching is performed by photolithography or the like, thereby forming the polysilicon shield 25.

The interlayer insulation film 8 is thereafter formed, in which an opening to be a contact region is formed by photolithography or the like. Aluminum is sputtered or evaporated at the opening and is selectively etched by photolithography or the like, thereby forming the shielding Al electrode 26. After depositing an insulation film by CVD or the like, the insulation film is etched by photolithography to partly form the passivation film 19, thereby obtaining the power semiconductor device shown in FIGS. 1 and 2. Since manufacturing steps of power semiconductor devices such as typical ICs, power devices and the like usually contain the above-described process flow, the aforementioned power semiconductor device can be formed in most cases merely by changing patterning methods without cost increase due to complexity of process.

As described, forming the polysilicon shield 25 over a region where surface inversion protection is required to be prevented (e.g., the substrate surface 23o) can prevent potential variations due to an external factor such as polarization in the mold.

Although the present embodiment has mentioned the example in which the impurity region 24 and the substrate (n-drift layer 3) have different conductivity types from each other, they may have the same conductivity type. Desired effects can also be obtained in this case, only if the polysilicon shield 25 covers the substrate surface 23o of the substrate (n-drift layer 3) and is set at such a potential that do not affect the impurity region 24.

<Second Preferred Embodiment>

Figure 4:
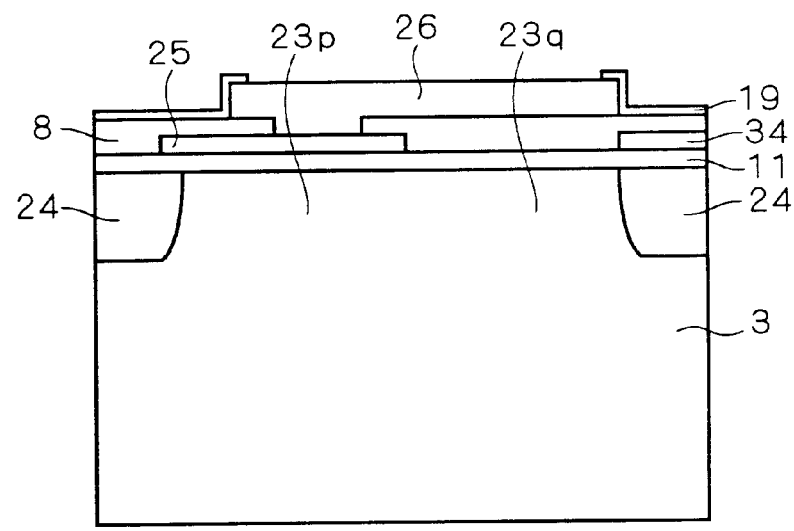
FIG. 4 is a cross-sectional view showing the power semiconductor device according to the second preferred embodiment.

FIG. 3 is a plane view showing a power semiconductor device according to a second preferred embodiment of the present invention, and FIG. 4 is a cross-sectional view thereof. Elements having the same functions as those in the first to fourth background arts and the first preferred embodiment are designated by the same reference numerals in the present embodiment.

As shown in FIGS. 3 and 4, the power semiconductor device has the impurity region 24 formed on peripheral portions of impurity substrate surfaces 23p and 23q of low concentration having the first conductivity type (n-type) which form the surface of the n– drift layer 3 as a substrate of the first conductivity type. The field oxide film 11, the polysilicon shield 25 and the shielding Al electrode 26 are formed in this order over the substrate surfaces 23p, 23q and the impurity region 24.

The polysilicon shield 25 is centered over a region of the substrate surface 23p and overlaps the boundary region between the substrate surface 23p and the impurity region 24 in the mentioned region of the substrate surface 23p.

The shielding Al electrode 26 is centered over predetermined regions of the substrate surface 23p and the substrate surface 23q other than the above-mentioned region of the substrate surface 23p, and overlaps the boundary region between the substrate surface 23p and the impurity region 24 and further overlaps the polysilicon shield 25. In the overlapped region of the polysilicon shield 25, the bottom of the Al electrode 26 and the upper portion of the polysilicon shield 25 are connected to each other. The shield 25 is heavily doped to have a low resistance, similarly to the first preferred embodiment.

Figure 61:
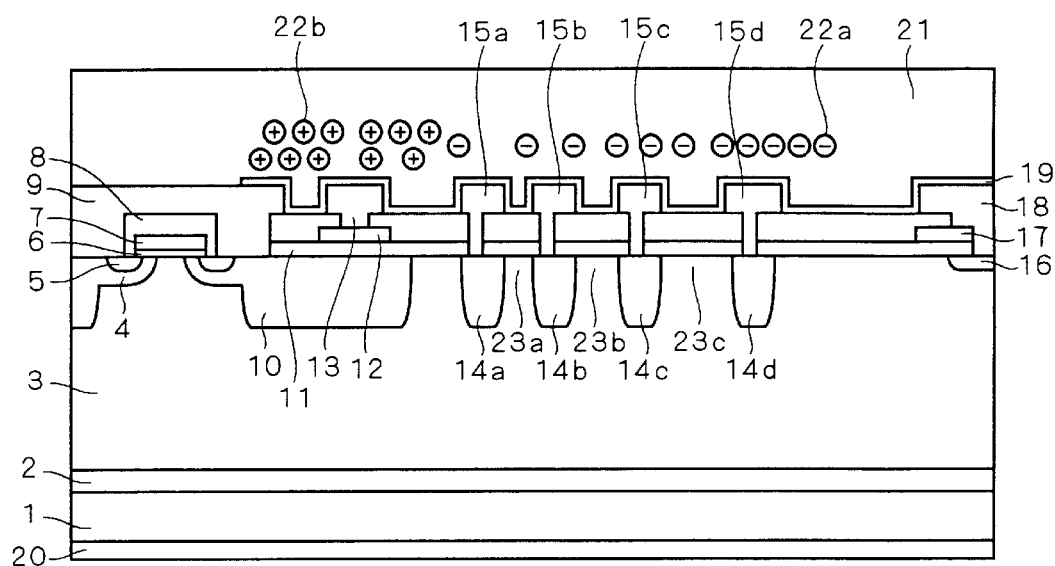
FIG. 61 is a sectional view showing the state that the upper surface of a chip is sealed with a transfer mold in the first background art.
Figure 62:
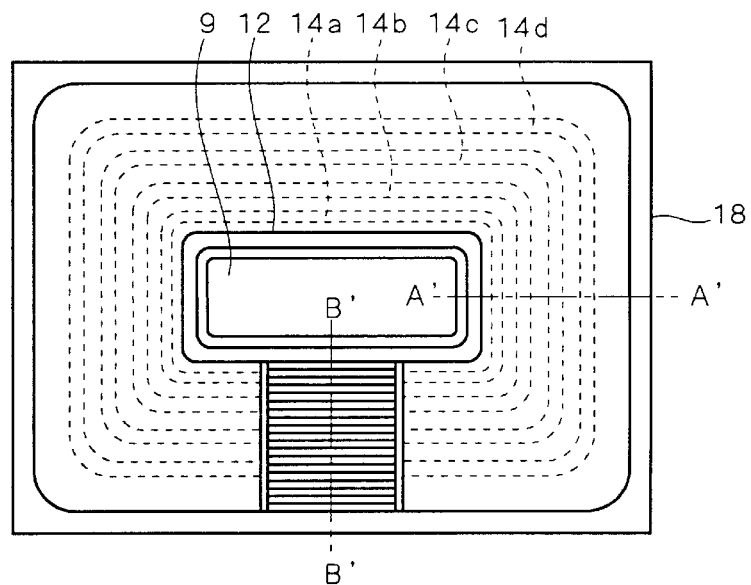
FIG. 62 is a plane view showing a power semiconductor device according to a fourth background art.
Figure 63:
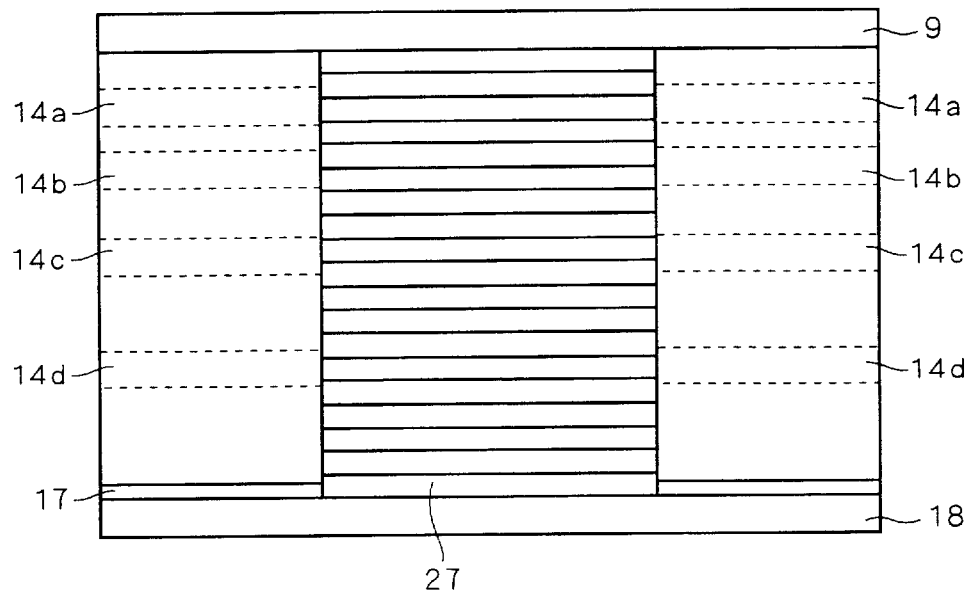
FIG. 63 is a partially enlarged plane view showing the power semiconductor device according to the fourth background art.
Figure 64:
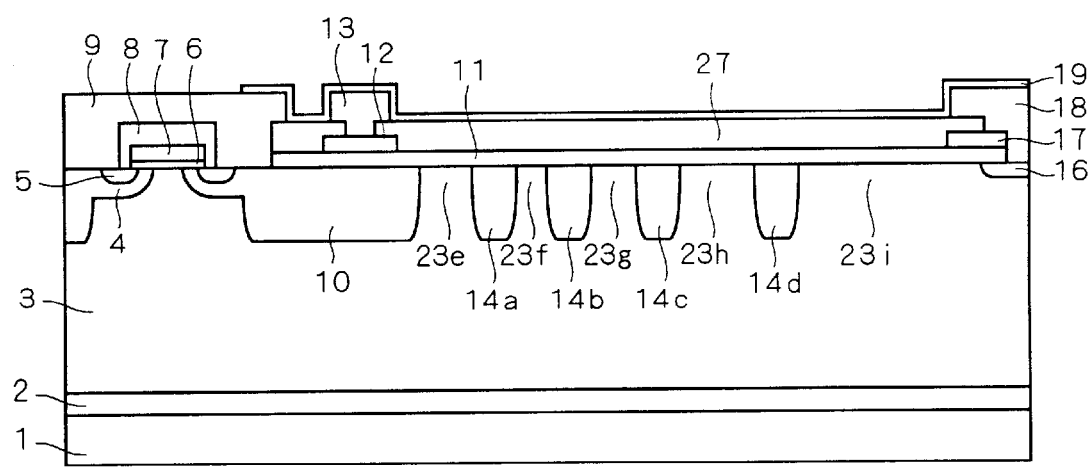
FIG. 64 is a cross-sectional view taken along the line A—A of FIG. 62.
Figure 65:
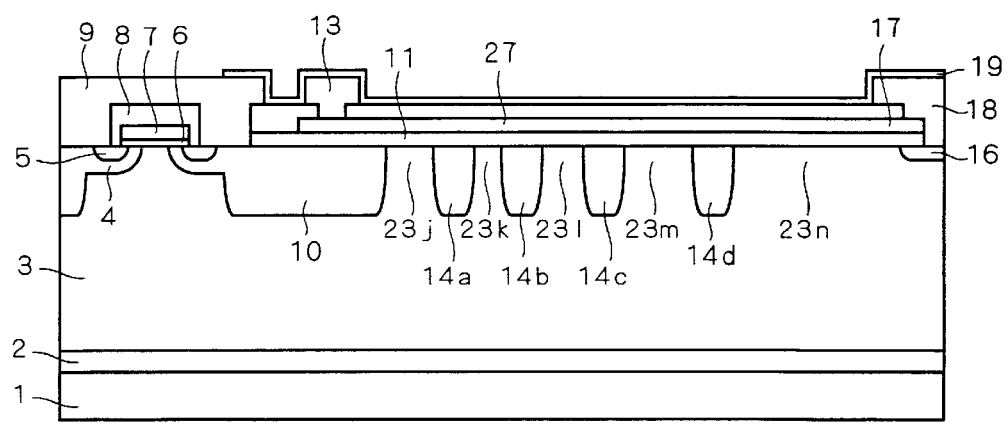
FIG. 65 is a cross-sectional view taken along the line B—B of FIG. 62.

In the present embodiment, part of a polysilicon element (conductive element) 34 different from the polysilicon shield 25 in potential is formed over a region of the impurity region 24 with the field oxide film 11 interposed therebetween. It is not preferable that the polysilicon element 34 and the polysilicon shield 25 be formed closely as they have different potentials. When the polysilicon shield 25 and the polysilicon element 34 should be spaced as described, it is not possible to entirely cover the substrate surfaces 23p and 23q with the polysilicon shield 25. However, the Al electrode 26 (i.e., another shield) covers a region over part of the substrate surfaces 23p and 23q that cannot be covered with the polysilicon shield 25, which allows avoidance of the influence of external charges such as polarization in the mold (cf. 21 in FIG. 61) over the passivation film 19 even when an obstacle is present.

Further, the polysilicon shield 25 is set at such a potential that the voltage at the substrate surfaces 23p and 23q are not reversed, thereby preventing surface inversion.

Furthermore, the present embodiment offers the same advantage as in the first embodiment in that the polysilicon shield 25, being heavily doped, does not have a potential gradient against variations in external potential.

<Third Preferred Embodiment>

FIG. 5 is a plane view showing a power semiconductor device according to a third preferred embodiment of the present invention, and FIG. 6 is a cross-sectional view thereof. Elements having the same functions as those in the first to fourth background arts and first and second preferred embodiments are designated by the same reference numerals in FIGS. 5 and 6.

In the power semiconductor device of the present embodiment, the polysilicon shield 25 is electrically connected to the impurity region 24 through the shielding Al electrode 26 provided on the upper end portion of the shield 25. The polysilicon shield 25 is centered over the middle part of an impurity substrate surface 23r of low concentration having the first conductivity type and formed such that its peripheral portion overlaps the boundary region between the substrate surface 23r and the impurity region 24.

This arrangement allows the polysilicon shield 25 to become equal in potential to the impurity region 24. Thus, the inner potential of the substrate surface 23r is determined only by the substrate 3, impurity region 24 and polysilicon shield 25, and is thus not affected by the mold polarization.

Further, the present embodiment eliminates the need to carry out interconnection with aluminum wires or the like for potential determination, for example, allowing reduction in device area and achieving cost reduction.

<Fourth Preferred Embodiment>

Figure 9:
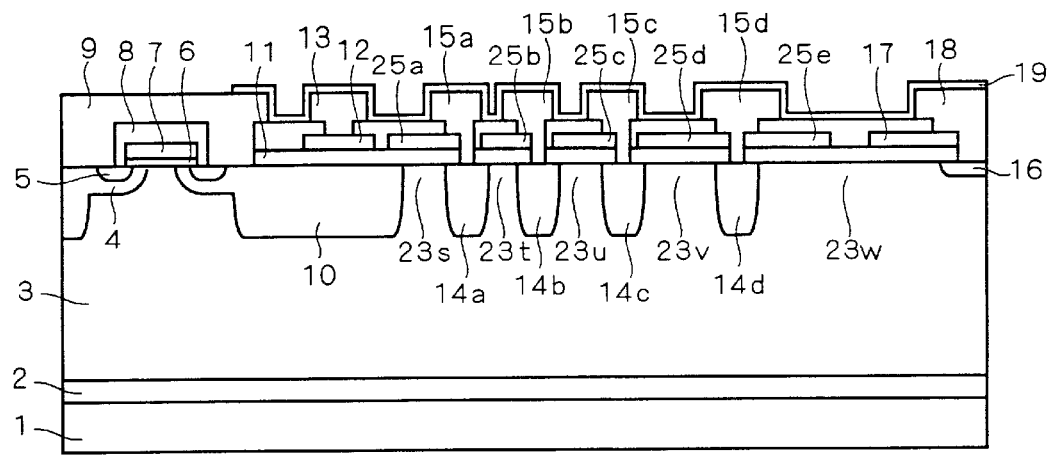
FIG. 9 is a cross-sectional view showing the power semiconductor device according to the fourth preferred embodiment.

FIG. 7 is a plane view showing a power semiconductor device according to a fourth preferred embodiment of the present invention. FIG. 8 is a partially enlarged plane view thereof and FIG. 9 is a cross-sectional view thereof. Elements having the same functions as those in the first to fourth background arts and the first to third preferred embodiments are designated by the same reference numerals in FIGS. 7 to 9. Reference numerals 23s to 23w designate impurity substrate surfaces of low concentration having the first conductivity type.

The power semiconductor device of the present embodiment is applicable to the outer peripheral structure of a vertical power device. FIG. 9 shows its basic structure in which the guard ring structure is applied to an N-type IGBT having a semiconductor element region constituted of the n+ emitter 5, gate oxide film 6, polysilicon gate electrode 7, interlayer insulation film 8, emitter electrode 9 and p+ isolation well 10.

Specifically, to suppress an electric field at an edge of the junction of the p+ isolation well (first impurity region of high concentration having the second conductivity type) 10 and the substrate surface 23s of the n– drift layer 3, the power semiconductor device is provided with the guard rings (third impurity regions of high concentration having the second conductivity type) 14a to 14d serving as p+ regions of high concentration, thereby maintaining breakdown voltage.

The shielding Al electrodes 15a to 15d are connected to the upper surfaces of the guard rings 14a to 14d, respectively. Polysilicon shields 25b to 25d are formed over the substrate surfaces 23t to 23v interposed between adjacent ones of the guard rings 14a to 14d, respectively, with the field oxide film (insulation film) 11 interposed therebetween.

Formed over part of the substrate surface 23w arranged on the outer peripheral side with respect to the outermost guard ring 14d is a polysilicon shield 25e with the field oxide film 11 interposed therebetween. The polysilicon shield 25e is formed to overlap the boundary region between the outermost guard ring 14d and the substrate surface 23w.

A polysilicon shield 25a is formed over the substrate surface 23s interposed between the p+ isolation well 10 arranged at the edge of the central semiconductor element region and the innermost guard ring 14a in a region overlapping the substrate surface 23s and the p+ isolation well 10 with the field oxide film (insulation film) 11 interposed between the shield 25a and the substrate surface 23s.

The polysilicon shields 25a to 25d are connected to the guard rings 14a to 14d on the outer peripheral side through the Al electrodes 15a to 15d on the higher potential side, respectively. This structure is provided throughout the peripheries of the guard rings 14a to 14d. In other words, exposed parts of the substrate surface 23s and 23t to 23v interposed between adjacent ones of the guard rings 14a to 14d, respectively, are all covered with the polysilicon shields 25a to 25d.

The surface state of the substrate surfaces 23s to 23v most sensitive to the influence of external potentials such as polarization in the mold (cf. 21 in FIG. 61) over the passivation film 19 is determined by the effect of the polysilicon shields 25a to 25d provided on the substrate surfaces 23s to 23v, respectively. Further, part of the substrate surface 23w on the outer peripheral side is also shielded with the polysilicon shield 25e, allowing the influence of external potentials to be relaxed. The potentials of the polysilicon shields 25a to 25e are determined by those of the guard rings 14a to 14d, respectively. Therefore, the power semiconductor device as a whole has a potential distribution determined only by its inner structure, which is thus less likely to be affected by external potentials.

The substrate surface 23w on the outermost periphery of the power semiconductor device is partly not provided with a polysilicon shield (corresponding to 25a to 25d).

Similarly to the respective background arts, the polysilicon plate (field plate) 17 is formed such that the depletion layer is prevented from being extended by means of the channel stopper 16.

Next, a method of manufacturing the power semiconductor device according to the present embodiment will be described.

First, impurities of high concentration having the second conductivity type are selectively implanted into the substrate 3 of the first conductivity type and are diffused to form the guard rings 14a to 14d, isolation well 10 and impurity region 24.

Next, the field oxide film 11 is formed by LOCOS.

Subsequently, after removing a cell portion of the field oxide film 11, the gate oxide film 6 is formed, following which polysilicon is deposited by CVD or the like.

Further, selective etching is performed by photolithography or the like to form the polysilicon gate electrode 7 of the IGBT, polysilicon shields 25a to 25e and polysilicon plate (field plate) 17.

The interlayer insulation film 8 is thereafter formed, in which a contact region is formed by photolithography or the like, following which aluminum is sputtered or evaporated and is selectively etched by photolithography or the like, thereby forming the emitter electrode 9, channel stopper ground electrode 18 and shielding Al electrodes 15a to 15d for grounding the guard rings 14a to 14d.

Finally, an insulation film is deposited, and is thereafter etched by photolithography to partly form the passivation film 19, thereby obtaining the power semiconductor device.

As has been described, the polysilicon shields 25a to 25e in the power semiconductor device of the present embodiment can be formed with nearly the same process as the standard process of the first background art for forming an IGBT, without causing cost increase due to complexity of process.

Further, a region prepared for an outer peripheral region of a power device to which an IGBT is applied has an enough width much greater than in the design rule of the above-described power semiconductor device, achieving the effects without particularly increasing chip area.

<Fifth Preferred Embodiment>

Figure 10:
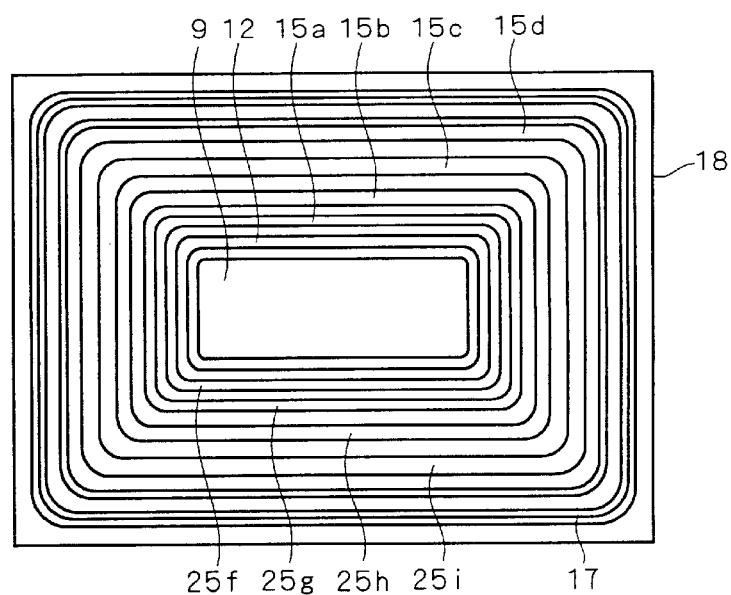
FIG. 10 is a plane view showing a power semiconductor device according to a fifth preferred embodiment of the present invention.
Figure 11:
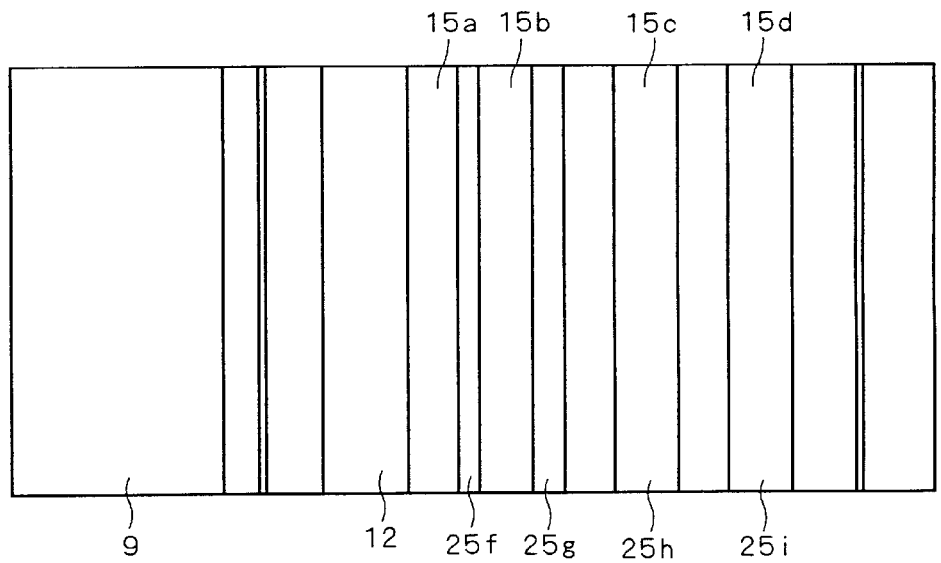
FIG. 11 is a partially enlarged plane view showing the power semiconductor device according to the fifth preferred embodiment.
Figure 12:
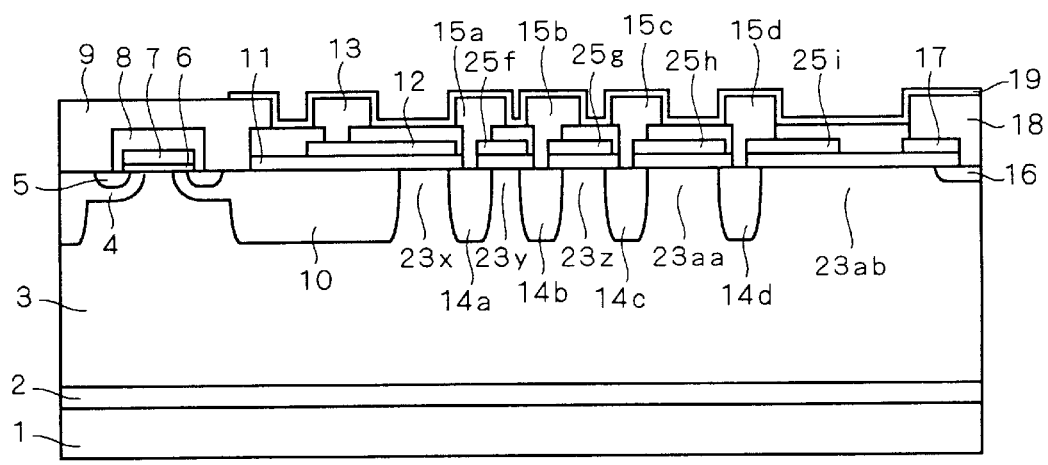
FIG. 12 is a cross-sectional view showing the power semiconductor device according to the fifth preferred embodiment.

FIG. 10 is a plane view showing a power semiconductor device according to a fifth preferred embodiment of the present invention, FIG. 11 is a partially enlarged plane view thereof and FIG. 12 is a cross-sectional view thereof. Elements having the same functions as those in the first to fourth background arts and the first to fourth preferred embodiments are designated by the same reference numerals in FIGS. 10 to 12.

The power semiconductor device shows the guard ring structure applied to an IGBT similarly to the fourth preferred embodiment, in which the guard rings 14a to 14d are provided in such a manner as to suppress the electric field at the edge of the junction of the p+ isolation well 10 and the n– drift layer 3, thereby maintaining breakdown voltage.

The shielding A1 electrodes 15a to 15d are formed over the guard rings 14a to 14d, respectively. Polysilicon shields 25f to 25i are formed over impurity substrate surfaces 23y to 23aa of low concentration having the first conductivity type interposed between adjacent ones of the guard rings 14a to 14d, respectively, and over part of an impurity substrate surface 23ab of low concentration provided on the outer peripheral side, respectively, with the field oxide film 11 interposed therebetween.

This power semiconductor device has the same structure as that of the fourth preferred embodiment in that the polysilicon shields 25f to 25i are formed over the substrate surfaces 23y to 23ab interposed between adjacent ones of the guard rings 14a to 14d, respectively, so as to overlap the respective boundary regions between the substrate surfaces 23y to 23ab and the guard rings 14a to 14d. The polysilicon shields 25f to 25i are each electrically connected to one end of a corresponding one of the guard rings 14a to 14d through the shielding A1 electrodes 15a to 15d, respectively. However, the polysilicon shields 25f to 25i are connected to the guard rings 14a to 14d on the inner peripheral side through the A1 electrodes 15a to 15d on the lower potential side, respectively, so that the polysilicon shields 25f to 25i become equal in potential to the guard rings 14a to 14d provided on the inner peripheral side thereof.

Part of the substrate surface 23ab on the outermost periphery is not provided with a polysilicon shield (corresponding to 25a to 25d) thereon.

Similarly to the respective background arts, the polysilicon plate (field plate) 17 is formed such that the depletion layer is prevented from being extended by means of the channel stopper 16.

As described, the polysilicon shields 25f to 25i and the guard rings 14a to 14d provided thereunder are respectively set equal in potential in the present embodiment, which serves to extend the depletion layer. This enables stable extension of the depletion layer with no influence of external charges.

In this power semiconductor device, the polysilicon gate electrode 12 is extended over the substrate surface 23x interposed between the innermost guard ring 14a and the p+ isolation well 10 and is used as a shield for shielding the substrate surface 23x similarly to the polysilicon shields 25f to 25i. The potential of the gate electrode 12 can easily be fixed as the electrode 12 is connected to the gate electrode 13.

<Sixth Preferred Embodiment>

Figure 13:
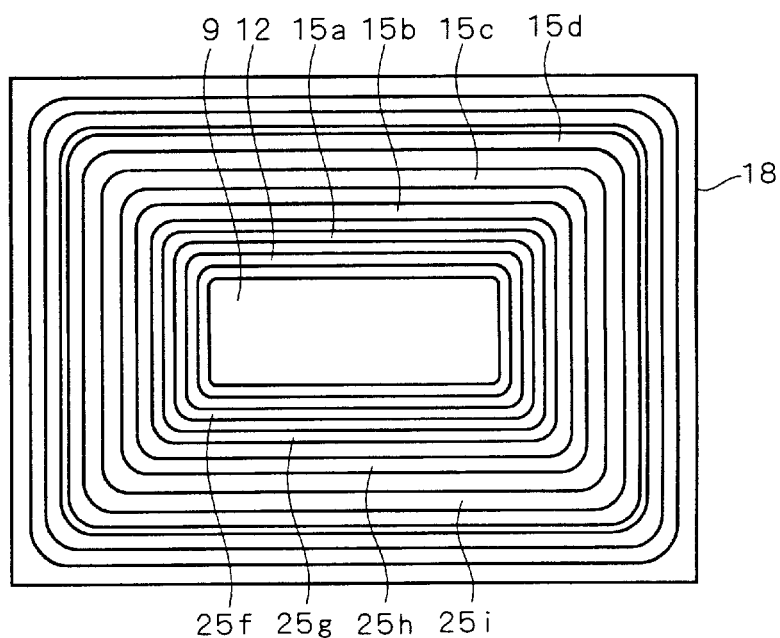
FIG. 13 is a plane view showing a power semiconductor device according to a sixth preferred embodiment of the present invention.
Figure 14:
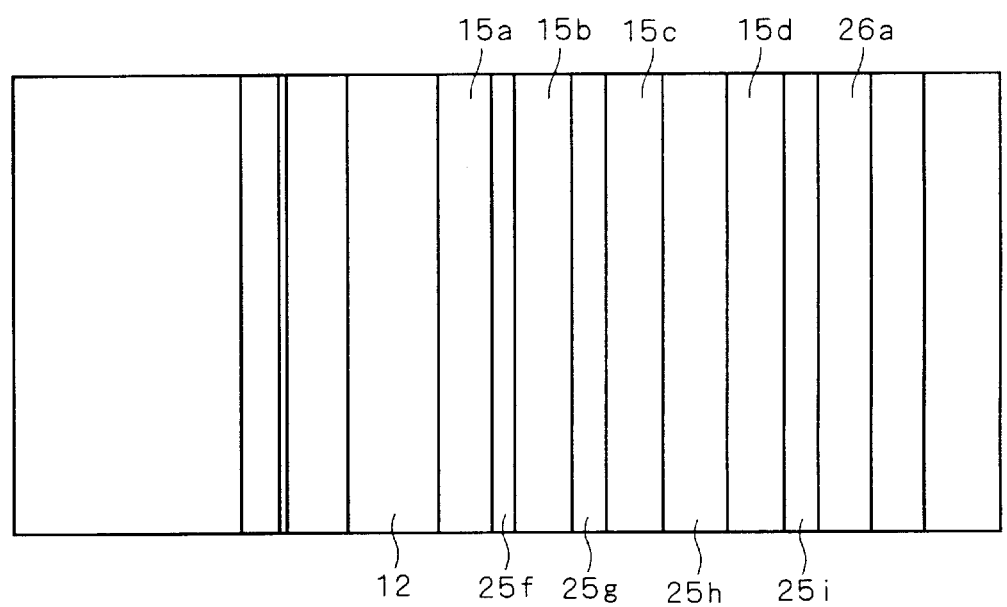
FIG. 14 is a partially enlarged plane view showing the power semiconductor device according to the sixth preferred embodiment.
Figure 15:
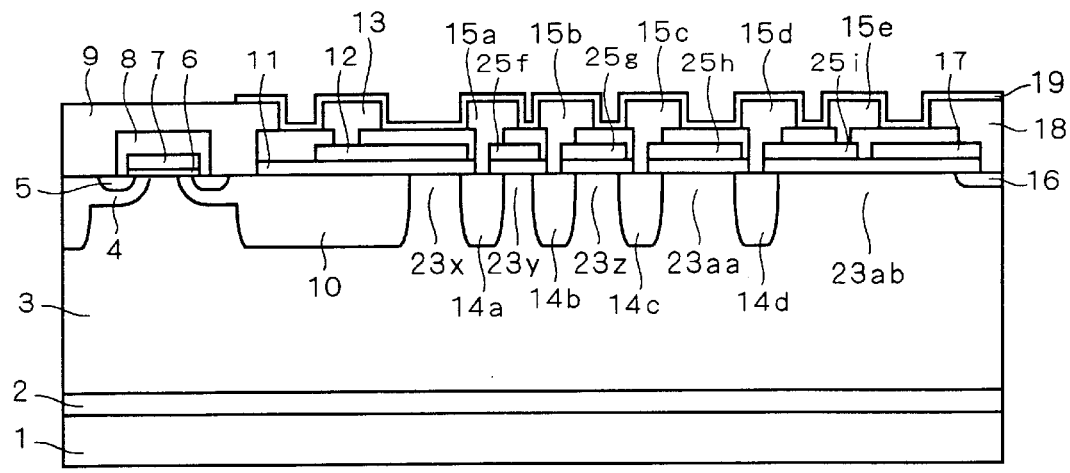
FIG. 15 a cross-sectional view showing the power semiconductor device according to the sixth preferred embodiment.

FIG. 13 is a plane view showing a power semiconductor device according to a sixth preferred embodiment of the present invention, FIG. 14 is a partially enlarged plane view thereof and FIG. 15 is a cross-sectional view thereof. Elements having the same functions as those in the first to fourth background arts and the first to fifth preferred embodiments are designated by the same reference numerals in FIGS. 13 to 15.

The power semiconductor device shows the guard ring structure applied to an IGBT similarly to the fourth and fifth preferred embodiments, in which the guard rings 14a to 14d are provided in such a manner as to suppress the electric field at the edge of the junction of the p+ isolation well 10 and the n– drift layer 3, thereby maintaining breakdown voltage.

This power semiconductor device has the same structure as that of the fourth and fifth preferred embodiments in that the polysilicon shields 25f to 25i are formed over the substrate surfaces 23y to 23ab interposed between adjacent ones of the guard rings 14a to 14d, respectively, so as to overlap the boundary regions between the substrate surfaces 23x to 23ab and the guard rings 14a to 14d, respectively, and the shields 25f to 25i are each electrically connected to one end of a corresponding one of the guard rings 14a to 14d through the shielding A1 electrodes 15a to 15d, respectively.

Further, the power semiconductor device of the present embodiment has the same structure as that of the fifth preferred embodiment in that the polysilicon gate electrode 12 is extended over the substrate surface 23x interposed between the innermost guard ring 14a and the p+ isolation well 10 and is used as a shield for shielding the substrate surface 23x, similarly to the polysilicon shields 25f to 25i.

Furthermore, in this embodiment, the polysilicon shield 25i and the polysilicon plate 17 both serving as shielding films are formed over the substrate surface 23ab interposed between the outermost guard ring 14d and the channel stopper 16, and an additional shielding A1 electrode 15e is placed above a space between the polysilicon shield 25i and the polysilicon plate 17.

The method of manufacturing the power semiconductor device of the present embodiment is the same as that of the fourth preferred embodiment, explanation of which is thus omitted here.

Generally, the outer peripheral structure of a power device such as IGBT, in many cases, separately includes a region in which a depletion layer is extended to relax an electric field and a region in which extension of a depletion layer is suppressed to suppress a punch-through effect (breakdown effect), thereby maintaining a desired breakdown voltage. In the present embodiment, such region separation can be achieved for obtaining a desired breakdown voltage by grounding a region in which extension of a depletion layer is desired to the innermost guard ring 14a on the inner peripheral side (lower potential side) and a region in which extension of a depletion layer is desired to be suppressed to the outermost guard ring 14d or the channel stopper 16 on the outer peripheral side (higher potential side).

Further, the space between the polysilicon shield 25i and the polysilicon field plate 17 is shielded with the additional shielding A1 electrode 15e, achieving the shielding effectiveness on the whole area of the outer peripheral portion, which can prevent the influence of external charges.

<Seventh Preferred Embodiment>

Figure 16:
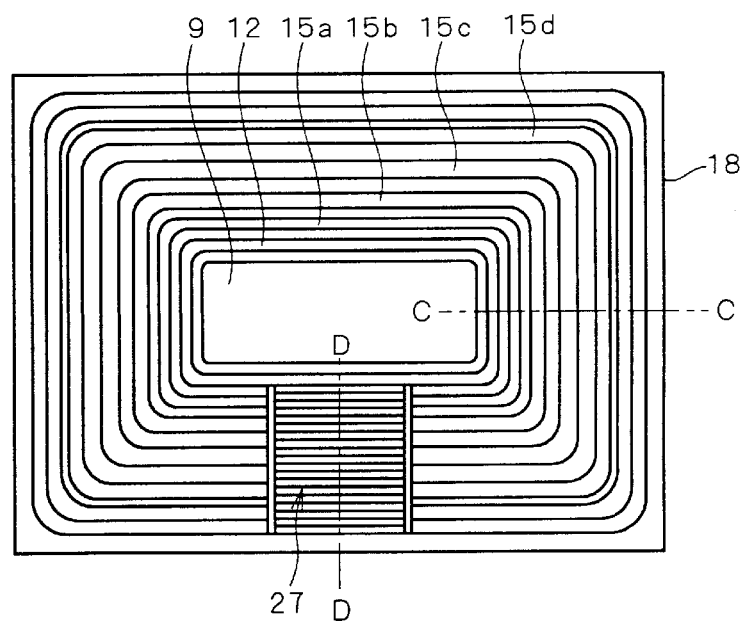
FIG. 16 is a plane view showing a power semiconductor device according to a seventh preferred embodiment of the present invention.
Figure 17:
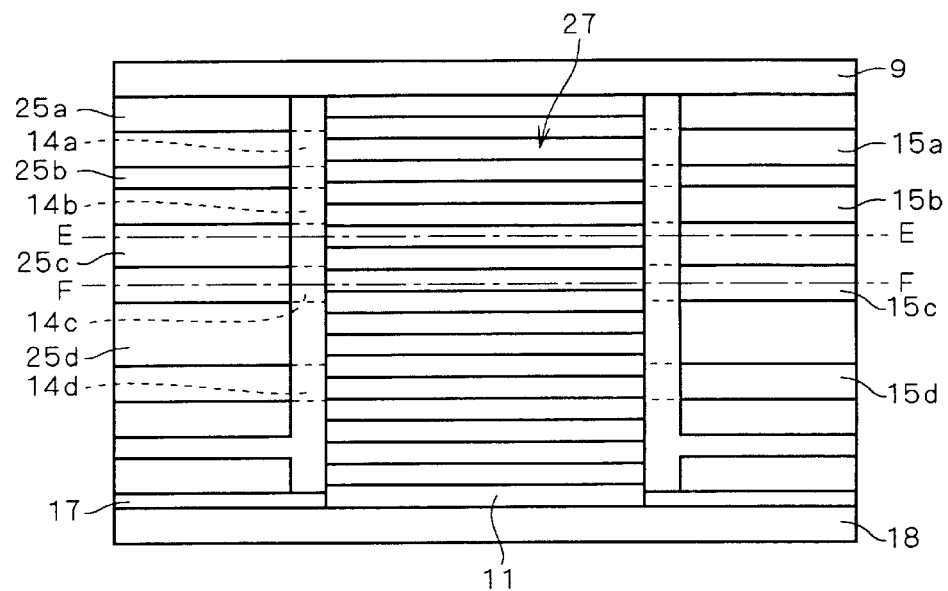
FIG. 17 is a partially enlarged plane view showing the power semiconductor device according to the seventh preferred embodiment.
Figure 18:
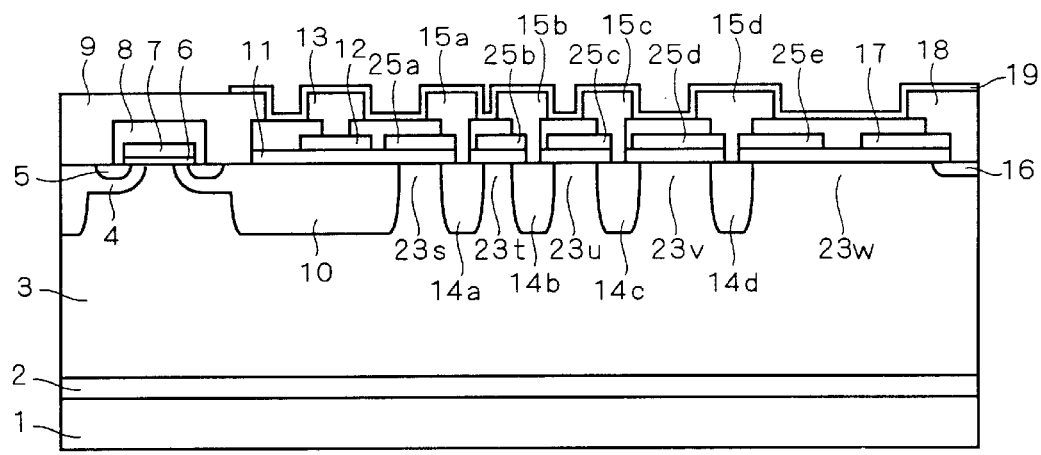
FIG. 18 is a cross-sectional view taken along the line C—C of FIG. 16.
Figure 19:
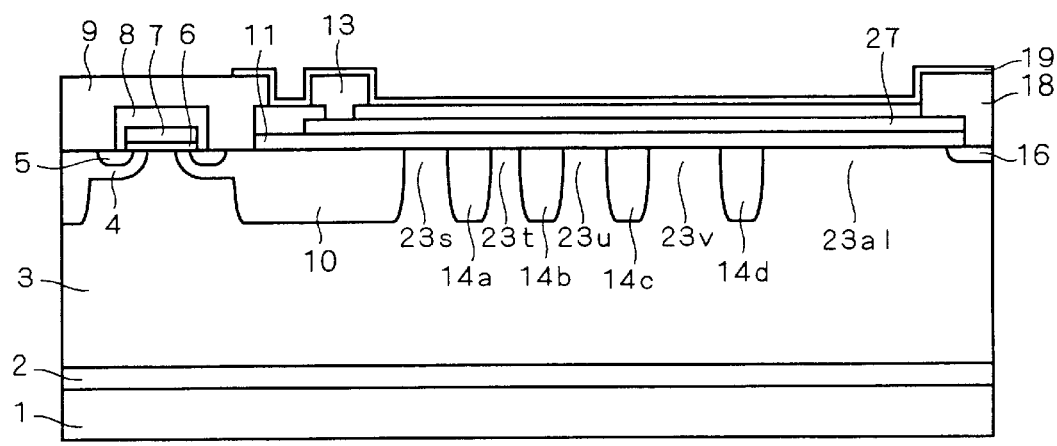
FIG. 19 is a cross-sectional view taken along the line D—D of FIG. 16.
Figure 20:
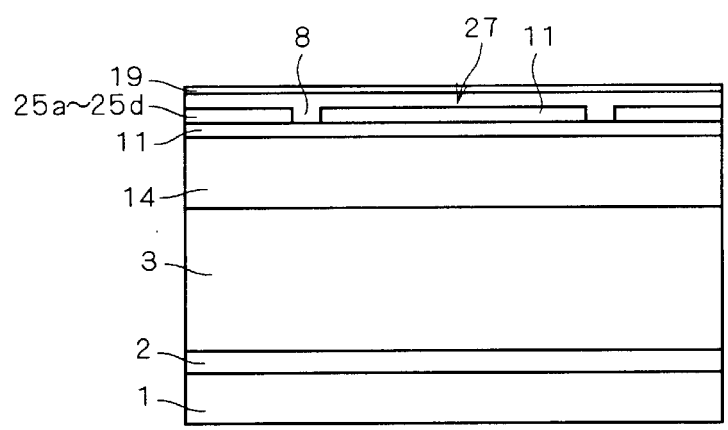
FIG. 20 is a cross-sectional view taken along the line E—E of FIG. 17.
Figure 21:
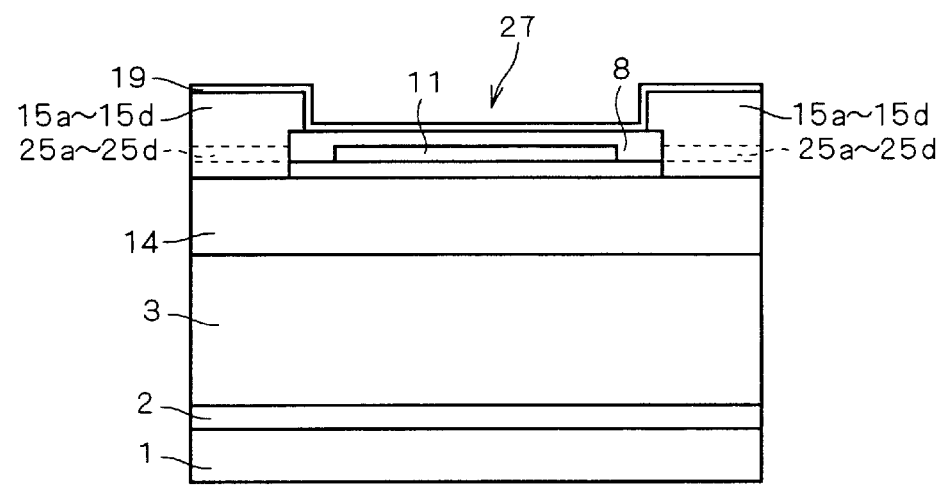
FIG. 21 is a cross-sectional view taken along the line F—F of FIG. 17.

FIG. 16 is a plane view showing a power semiconductor device according to a seventh preferred embodiment of the present invention, and FIG. 17 is a partially enlarged plane view thereof. FIGS. 18 and 19 are cross-sectional views taken along the lines C—C and D—D of FIG. 16, respectively. FIGS. 20 and 21 are cross-sectional views taken along the lines E—E and F—F of FIG. 17, respectively. Elements having the same functions as those in the first to fourth background arts and the first to sixth preferred embodiments are designated by the same reference numerals in FIGS. 16 to 21.

The power semiconductor device of the present embodiment is applicable to the outer peripheral structure of a vertical power device similarly to the fourth to sixth preferred embodiments and is applied to an IGBT having the polysilicon Zener diode 27 (shield) for overvoltage protection formed between the channel stopper 16 and the polysilicon gate electrode 12.

This power semiconductor device has the same structure as that of the fifth preferred embodiment in that the polysilicon shields 25a to 25d are formed over the impurity substrate surface 23s on the inner peripheral side with respect to the guard rings 14a to 14d, substrate surfaces 23t to 23v interposed between adjacent ones of the guard rings 14a to 14d, respectively, and substrate surface 23w on the outer peripheral side with respect to the guard rings 14a to 14d so as to overlap the respective boundary regions between the substrate surfaces 23s to 23w and the guard rings 14a to 14d serving as the impurity regions of high concentration having the second conductivity type, and the shields 25a to 25d are each electrically connected to a corresponding one of the guard rings 14a to 14d on the outer peripheral side through the shielding Al electrodes 15a to 15d, respectively. In the power semiconductor device of the present embodiment, the boundary regions between the polysilicon Zener diode 27 and the polysilicon shields 25a to 25d have a width as narrow as possible to a degree that can ensure electric insulation therebetween.

This power semiconductor device is designed to operate in a normal operation such that the guard rings 14a to 14d in the substrate 3 and the polysilicon Zener diode 27 provided immediately thereover are not unmatched in potential and such that the diode 27 is broken down at a predetermined voltage lower than breakdown voltage of the guard rings 14a to 14d.

Even when polarization occurs in the mold (cf. 21 in FIG. 61) over the passivation film 19, the power semiconductor device is less likely to be affected by the mold polarization since most of the regions of the guard rings 14a to 14d are covered with the polysilicon shields 25a to 25d. Thus, a disadvantage such as deterioration in breakdown voltage due to polarization in the mold 21 is unlikely to arise.

<Eighth Preferred Embodiment>

Figure 22:
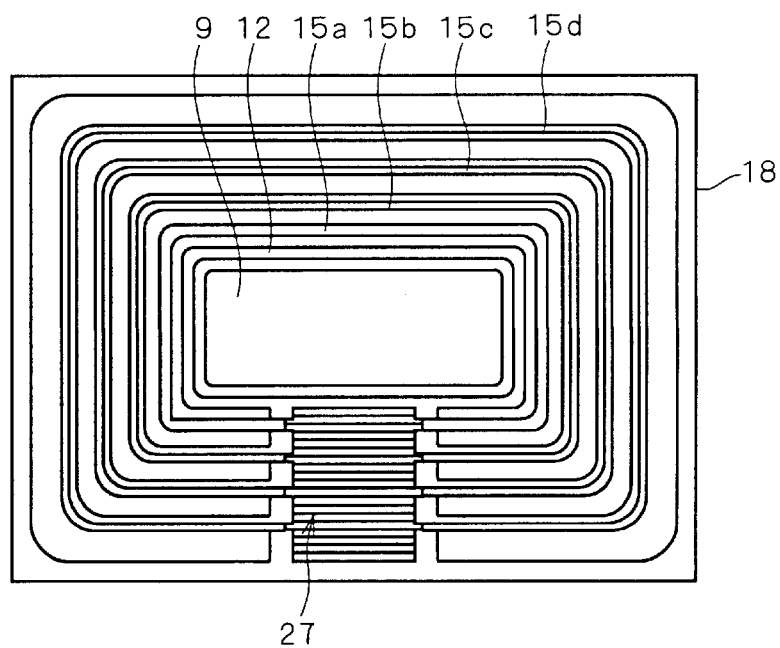
FIG. 22 is a plane view showing a power semiconductor device according to an eighth preferred embodiment of the present invention.
Figure 23:
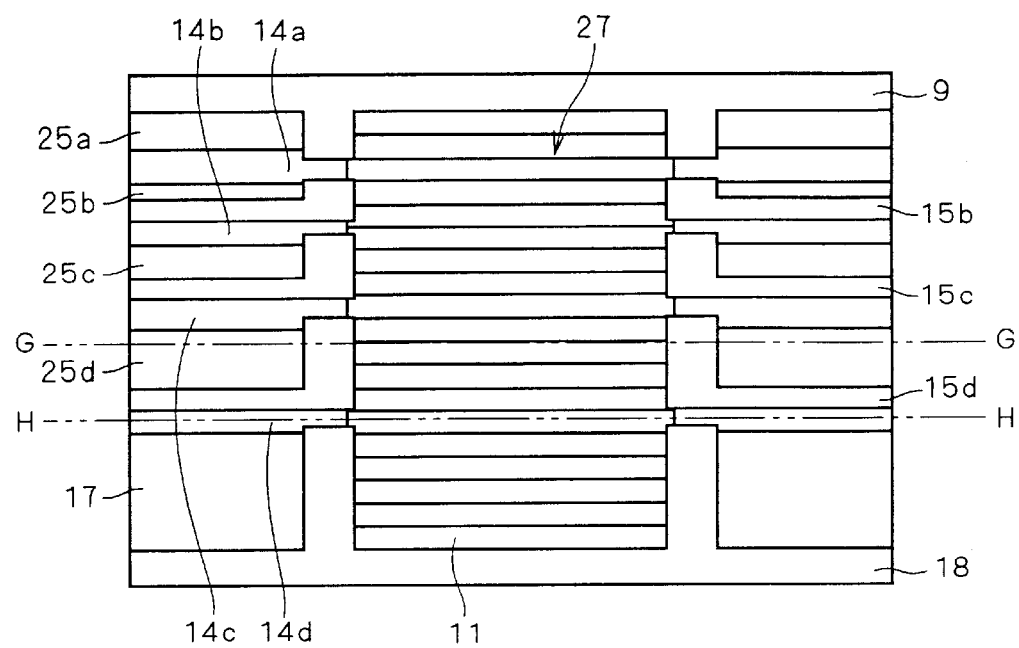
FIG. 23 is a partially enlarged plane view showing the power semiconductor device according to the eighth preferred embodiment.
Figure 24:
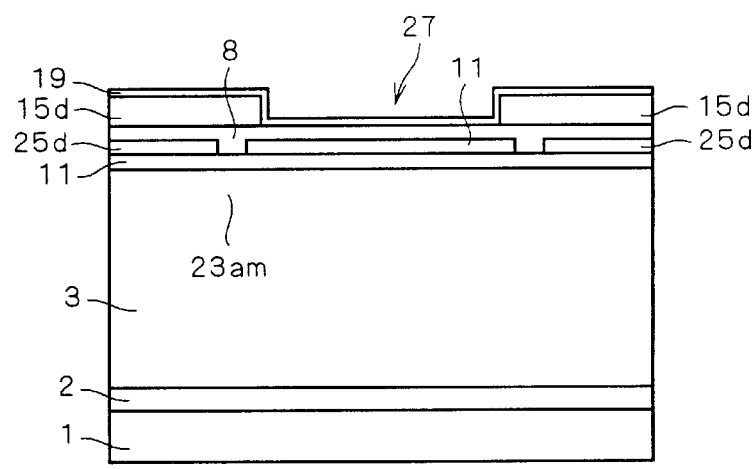
FIG. 24 is a cross-sectional view taken along the line G—G of FIG. 23.
Figure 25:
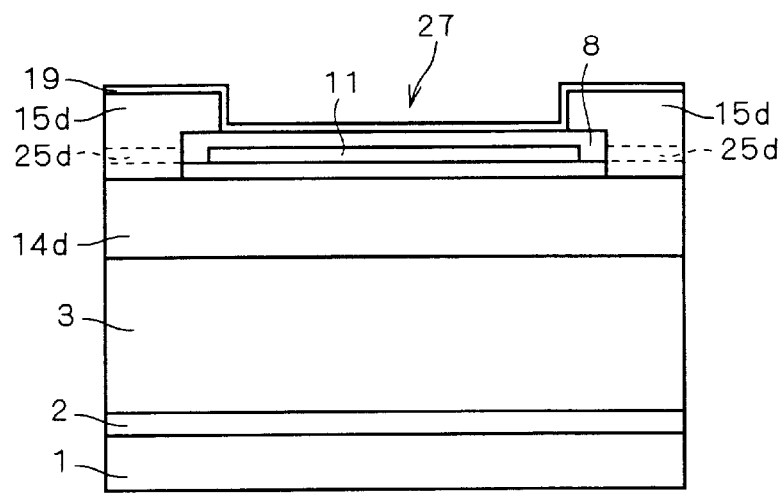
FIG. 25 is a cross-sectional view taken along the line H—H of FIG. 23.

FIG. 22 is a plane view showing a power semiconductor device according to the present invention, and FIG. 23 is a partially enlarged plane view thereof. FIGS. 24 and 25 are cross-sectional views taken along the lines G—G and H—H of FIG. 23. Elements having the same functions as those in the first to fourth background arts and the first to seventh preferred embodiments are designated by the same reference numerals in FIGS. 22 to 25.

The power semiconductor device of the present embodiment is applicable to the outer peripheral structure of a vertical power device similarly to the fourth to seventh preferred embodiments, having the polysilicon Zener diode (semiconductor member) 27 for overvoltage protection partly formed between the collector (channel stopper ground electrode 18) and the polysilicon gate electrode 12, similarly to the seventh preferred embodiment shown in FIG. 18 and the like. The polysilicon shields 25a to 25d are not connected to the polysilicon Zener diode 27 as the interlayer insulation film 8 is interposed therebetween. Different from the sixth preferred embodiment, the respective boundary regions between the polysilicon Zener diode 27 and the polysilicon shields 25a to 25d are covered with the shielding Al electrodes (conductive members) 15a to 15d having the same potential as the shields 25a to 25d, as shown in FIG. 23.

With this arrangement, necessary portions including a substrate surface 23am are all covered with the polysilicon shields 25a to 25d, shielding Al electrodes 15a to 15d and polysilicon Zener diode 27 as shown in FIGS. 24 and 25. Thus, the distribution of a depletion layer in the outer peripheral portion for maintaining breakdown voltage is determined only by the inner structure with no influence of polarization in the mold (cf. 21 in FIG. 61) over the passivation film 19 and the like, so that the power device can maintain a stable breakdown voltage.

The innermost polysilicon shield 25a is connected to the polysilicon gate electrode 12 while the rest of the shields 25b to 25d are respectively connected to the guard rings 14a to 14d on the outer peripheral side (higher potential side) as shown in FIGS. 9 and 18, for example, however, the semiconductor device is not limited to such structure. Connecting the polysilicon shields 25a to 25d to either side of the outer peripheral side (higher potential side) or inner peripheral side (lower potential side) can achieve the effect of eliminating the influence of polarization in the mold (cf. 21 in FIG. 61) over the passivation film 19. It is selectively determined to which side the polysilicon shields 25a to 25d are connected, the higher potential side or lower potential side, such that the potential distribution of the diode 27 corresponds as precisely as possible to the influence exerted upon the potential distribution of the substrate surface 23am and the like. This allows the power semiconductor device to maintain a stable breakdown voltage.

<Ninth Preferred Embodiment>

Figure 26:
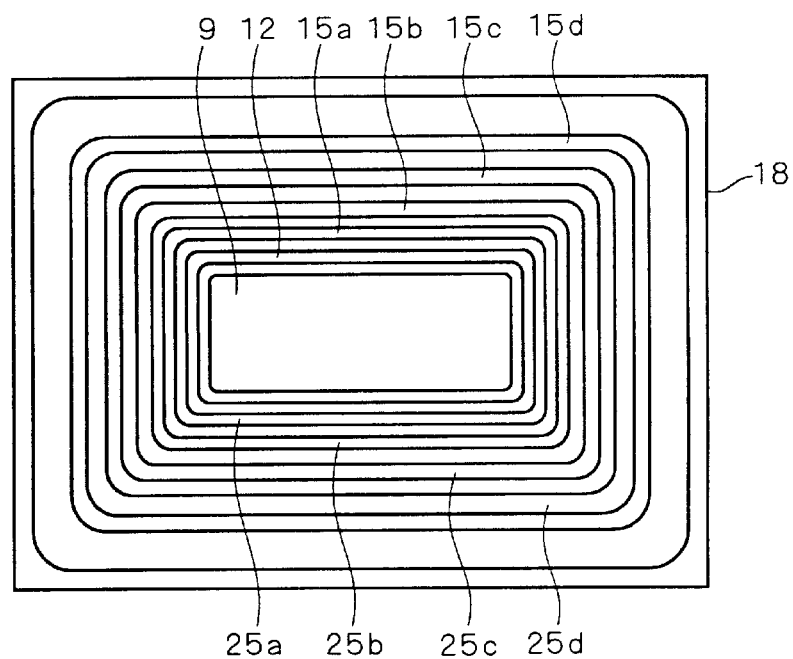
FIG. 26 is a plane view showing a power semiconductor device according to a ninth preferred embodiment of the present invention.
Figure 27:
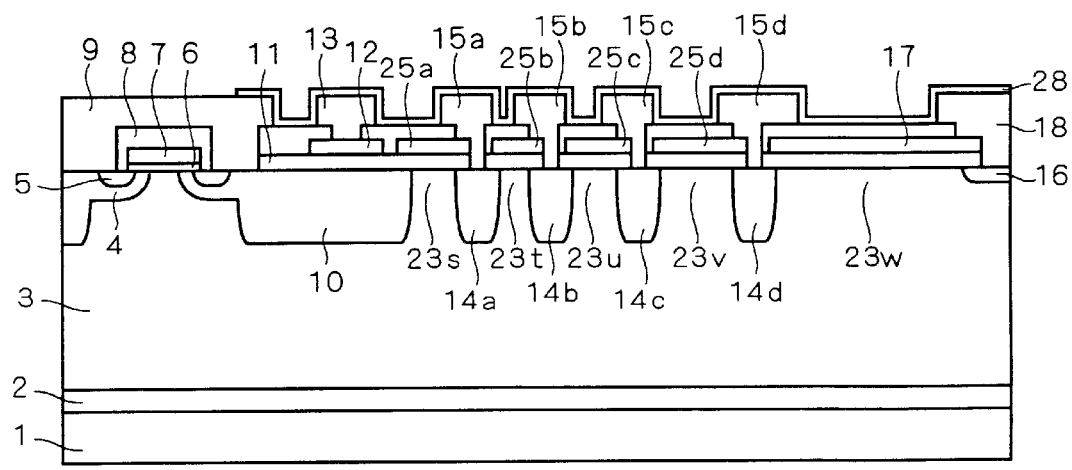
FIG. 27 is a cross-sectional view showing the power semiconductor device according to the ninth preferred embodiment.

FIG. 26 is a plane view showing a power semiconductor device according to a ninth preferred embodiment of the present invention, and FIG. 27 is a cross-sectional view thereof. Elements having the same functions as those in the first to fourth background arts and the first to eighth preferred embodiments are designated by the same reference numerals in FIGS. 26 and 27.

This power semiconductor device has the same structure as that of the third preferred embodiment shown in FIGS. 5 and 6 in that the polysilicon shields 25a to 25d are formed over the substrate surface 23s on the inner peripheral side with respect to the guard rings 14a to 14d and the substrate surfaces 23t to 23v interposed between adjacent ones of the guard rings 14a to 14d, respectively, so as to overlap the respective boundary regions between the substrate surfaces 23s to 23v and the guard rings 14a to 14d serving as the impurity regions of high concentration having the second conductivity type, and the shields 25a to 25d are each electrically connected to a corresponding one of the guard rings 14a to 14d on the outer peripheral side through the shielding Al electrodes 15a to 15d, respectively.

The power semiconductor device of the present embodiment is provided with a high-insulative passivation film 28 as a passivation film (corresponding to the film 19 shown in FIGS. 5 and 6 in the third preferred embodiment).

A commercially practical passivation film is generally formed of an LTO film, plasma oxide film, or the like. When formed of an LTO film or plasma oxide film, the passivation film 28 itself produces little effect of reducing the influence of mold polarization.

Even with the use of such passivation film 28, however, the influence of polarization in the film 28 is cancelled out by the shielding Al electrodes 15a to 15d, allowing a stable breakdown voltage to be maintained with no influence exerted upon the guard rings 14a to 14d and the substrate surfaces 23s to 23w serving as an underlying substrate.

Needless to say, the passivation film 28 may be formed of a high-insulative nitride film or the like for improving the effect of suppressing variations in breakdown voltage to reduce the insulation properties as compared to an LTO film or plasma oxide film.

<Tenth Preferred Embodiment>

Figure 28:
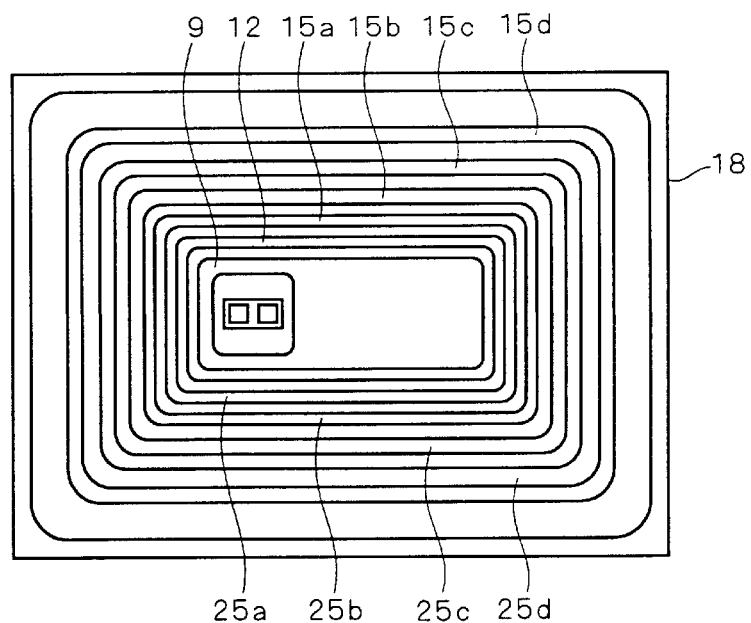
FIG. 28 is a plane view showing a power semiconductor device according to a tenth preferred embodiment of the present invention.
Figure 29:
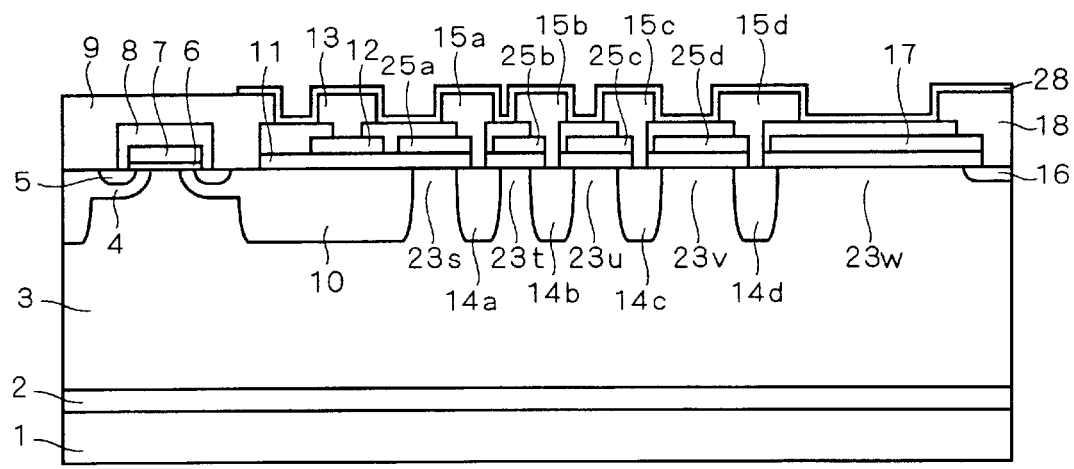
FIG. 29 is a cross-sectional view showing the power semiconductor device according to the tenth preferred embodiment.
Figure 30:
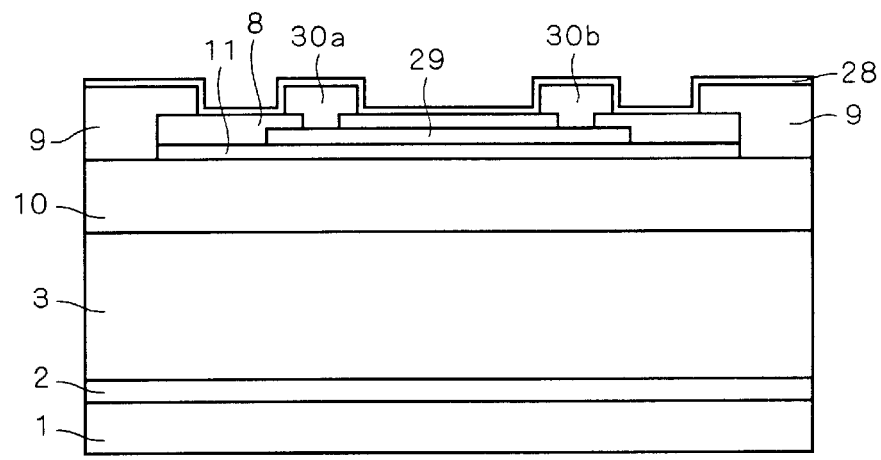
FIG. 30 is a partially enlarged cross-sectional view showing the power semiconductor device according to the tenth preferred embodiment.

FIG. 28 is a plane view showing a power semiconductor device according to a tenth preferred embodiment of the present invention, FIG. 29 is a cross-sectional view thereof and FIG. 30 is a partially enlarged cross-sectional view thereof. Elements having the same functions as those in the first to fourth background arts and the first to ninth preferred embodiments are designated by the same reference numerals in FIGS. 28 to 30.

The power semiconductor device according to the present embodiment includes the passivation film 28 similarly to the ninth embodiment as well as a polysilicon element 29 of low concentration in a region on the same chip. The rest of the components such as the polysilicon shields 25a to 25d and the shielding Al electrodes 15a to 15d have similar structures as those shown in FIG. 27 of the ninth preferred embodiment, for example.

Applied to the polysilicon element 29 is, for example, a high-resistive element formed of polysilicon or the impurity region of low concentration of the polysilicon Zener diode 27 as described in the seventh embodiment.

Generally, the polysilicon element 29 is greatly affected by hydrogen contained in the passivation film 28, resulting in variations in its properties. Thus, it is difficult to employ a film producing a reaction that generates a great amount of hydrogen such as a CVD nitride film as indicated by the following formula (1), which imposes limitations on usable films.

$$SiH_4 + NH_3 \rightarrow SiNH + 3H_2 \qquad (1)$$

The LTO film, plasma oxide film and the like, though exerting relatively little effect of hydrogen upon others, are not capable of canceling out the influence of polarization in the passivation film (mold film) 28, thus affecting the substrate surface. A film that can control the insulation properties and the amount of generation of hydrogen could achieve compatibleness between the exertion of relatively little effect of hydrogen and the capability to cancel out the influence of polarization, however, such film has not yet gone into actual use.

In the present embodiment, even with the use of either of the above-described oxide films, the influence of polarization in the passivation film (mold film) 28 is cancelled out by the polysilicon shields 25a to 25d and the shielding Al electrodes 15a to 15d with no influence exerted upon the guard rings 14a to 14d and the substrate surfaces 23s to 23w serving as an underlying substrate. Even if a high-insulative film that generates little amount of hydrogen is used for the passivation film 28, the guard rings 14a to 14d and the substrate surfaces 23s to 23w are not affected, allowing suppression of variations in characteristics of the polysilicon element of low concentration.

<Eleventh Preferred Embodiment>

Figure 31:
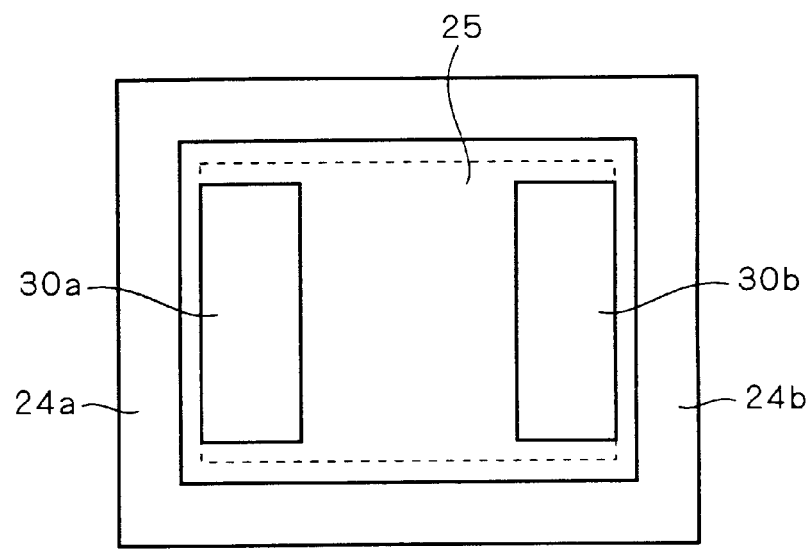
FIG. 31 is a plane view showing a power semiconductor device according to an eleventh preferred embodiment of the present invention.
Figure 32:
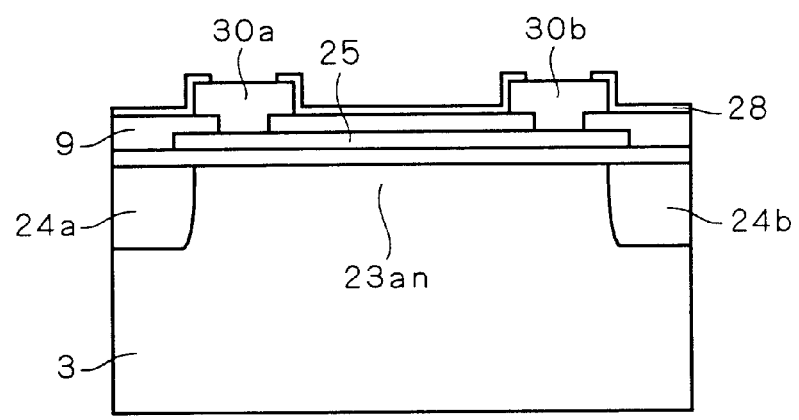
FIG. 32 is a cross-sectional view showing the power semiconductor device according to the eleventh preferred embodiment.

FIG. 31 is a plane view showing a power semiconductor device according to an eleventh preferred embodiment of the present invention, and FIG. 32 is a cross-sectional view thereof. Elements having the same functions as those in the first to fourth background arts and the first to tenth preferred embodiments are designated by the same reference numerals in FIGS. 31 and 32.

FIGS. 31 and 32 illustrate a pair of shielding Al electrodes 30a and 30b, an impurity substrate surface 23an of low concentration having the first conductivity type (n-type), a pair of impurity regions 24a and 24b of high concentration having the second conductivity type (p-type) and the passivation film 28.

The polysilicon shield 25 is a resistor containing impurities of low concentration and having a predetermined high resistance value, which is centered over the middle part of the substrate surface 23an and formed such that its peripheral portion overlaps the respective boundary regions between the substrate surface 23an and the impurity regions 24a, 24b. The shielding Al electrodes 30a and 30b are provided on both ends of the polysilicon shield 25, respectively.

The impurity regions 24a and 24b are both connected to the polysilicon shield 25, and have potentials different from each other. This causes the polysilicon shield 25 to have a potential gradient inside thereof.

Maintaining voltage between the impurity regions 24a and 24b allows determination of breakdown voltage at the junctions of the substrate 3 and the impurity regions 24a, 24b.

If the polysilicon shield 25 is not provided over the substrate surface 23an, polarization in the passivation film (mold film) 28 may cause surface inversion and storage charges at the substrate 3, resulting in variations in the degree that the depletion layers of the impurity regions 24a and 24b extend, which will cause variations in breakdown voltage.

Further, the passivation film 28 is a high-insulative film, so that the substrate surface is susceptible to external charges.

In the power semiconductor device of the present embodiment, however, the polysilicon shield 25 is provided to cover the substrate surface 23an, so that external charges do not affect the substrate surface 23an. The potential gradient of the polysilicon shield 25 is set to be determined by the two potentials of the impurity regions 24a and 24b, and the influence upon the substrate surface 23an is determined by the potential gradient of the shield 25, eliminating the influence of external charges.

The resistivity of the polysilicon shield 25 and the potential of the pair of shielding Al electrodes 30a and 30b may be determined such that an amount of charges can flow in unit time which is greater than that in the polarization in the passivation film (mold film) 28 stored in the same unit time under service conditions. The charges stored in the passivation film 28 are then cancelled out in the polysilicon shield 25 to flow out through the electrodes, preventing the underlying substrate surface 23an from being affected. It is preferable that the polysilicon shield 25 have as high resistivity as possible within a range that such requirements can be satisfied. It is also preferable that the shielding Al electrodes 30a and 30b be matched with the impurity regions 24a and 24b in potential.

As described, the power semiconductor device of the present embodiment determines the potential of the polysilicon shield 25 for eliminating the influence of external charges. Thus, the use of a high-insulative film as the passivation film (mold film) 28 that exerts the influence of polarization in the film 28 and the like upon others does not cause variations in breakdown voltage of the device due to variations in external potentials such as polarization.

Further, the power semiconductor device can be manufactured with exactly the same process as in the first preferred embodiment and the like, which thus can be formed merely by changing photolithography patterns in most cases without cost increase due to complexity of process.

Although the two shielding Al electrodes 30a and 30b have been described in the present embodiment as an example, there may be provided three or more electrodes having different potentials to one another.

<Twelfth Preferred Embodiment>

Figure 33:
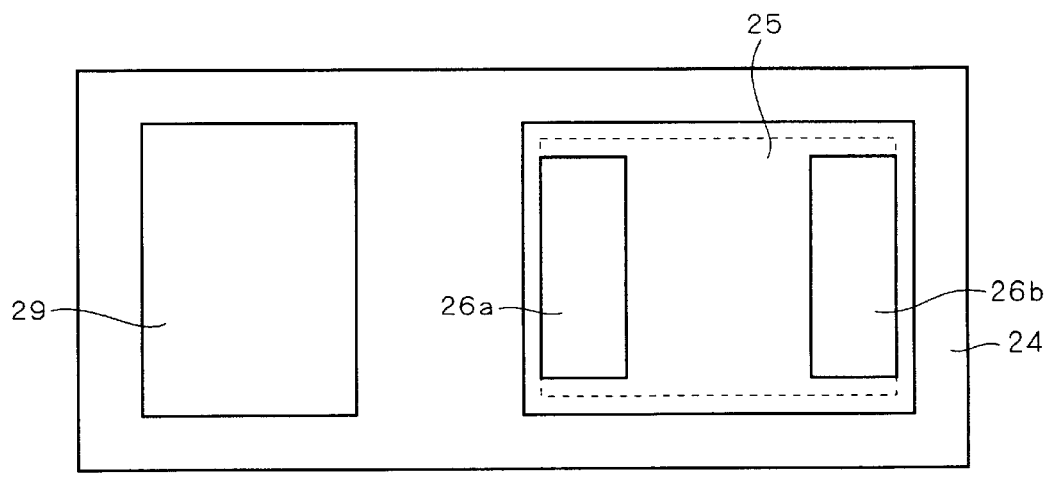
FIG. 33 is a plane view showing a power semiconductor device according to a twelfth preferred embodiment of the present invention.
Figure 34:
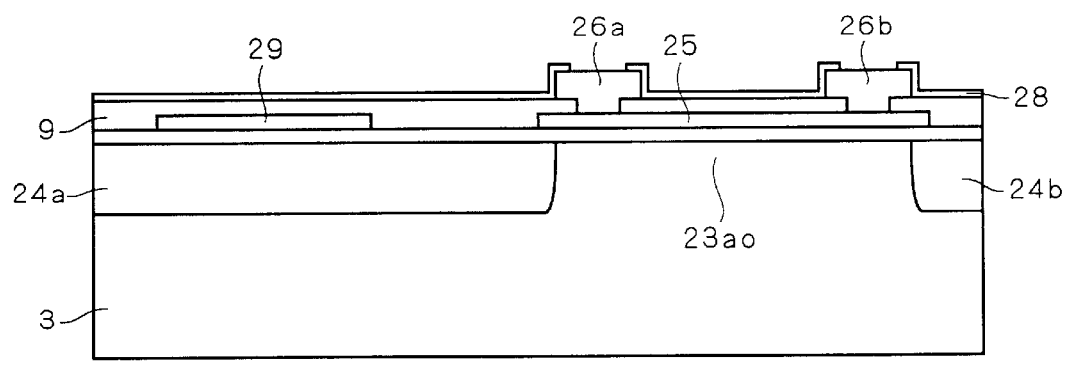
FIG. 34 is a cross-sectional view showing the power semiconductor device according to the twelfth preferred embodiment.

FIG. 33 is a plane view showing a power semiconductor device according to the present invention and FIG. 34 is a cross-sectional view thereof. Elements having the same functions as those in the first to fourth background arts and the first to eleventh preferred embodiments are designated by the same reference numerals in FIGS. 33 and 34. FIG. 34 illustrates an impurity substrate surface 23ao of low concentration having the first conductivity type (n-type).

The polysilicon shield 25 contains impurities of low concentration, has a predetermined high resistance value, and is centered over the substrate surface 23ao such that its peripheral portion overlaps the boundary regions between the substrate surface 23ao and the impurity regions 24a, 24b.

Two different shielding Al electrodes 26a and 26b are formed on and connected to the upper ends of the polysilicon shield 25, respectively.

The impurity regions 24a and 24b have potentials different from each other.

The power semiconductor device of the present embodiment is provided with the high-resistive polysilicon element 29 of low concentration similarly to the tenth preferred embodiment as well as the passivation film 19 containing little amount of hydrogen.

When the passivation film 19 containing little amount of hydrogen is applied, a disadvantage does not arise such as variations in conductivity of the polysilicon element 29, however, there is a severe influence of polarization as a low-insulation film (semi-insulation film) cannot be formed. Conversely, the use of a semi-insulation film for the passivation film 19 allows the influence of polarization exerted upon the substrate surface to be relaxed, however, it is difficult to suppress generation of hydrogen with current techniques, causing the interface of the substrate 3, particularly the interface between the substrate 3 and the polysilicon components 25, 29 to be affected by hydrogen, which disadvantageously results in variations in conductivity of the polysilicon element 29 and the like.

In the present embodiment, however, the passivation film 19 containing little amount of hydrogen is applied, which can suppress variations in properties of the polysilicon element 29.

Further, the polysilicon shield 25 is provided and its potential is determined for eliminating the influence of external charges, which does not cause variations in breakdown voltage of the device due to variations in external potentials such as polarization.

Needless to say, it is possible to prevent inversion at the substrate surface 23ao immediately under the polysilicon shield 25 even in the structure not provided with the polysilicon element 29.

<Thirteenth Preferred Embodiment>

Figure 37:
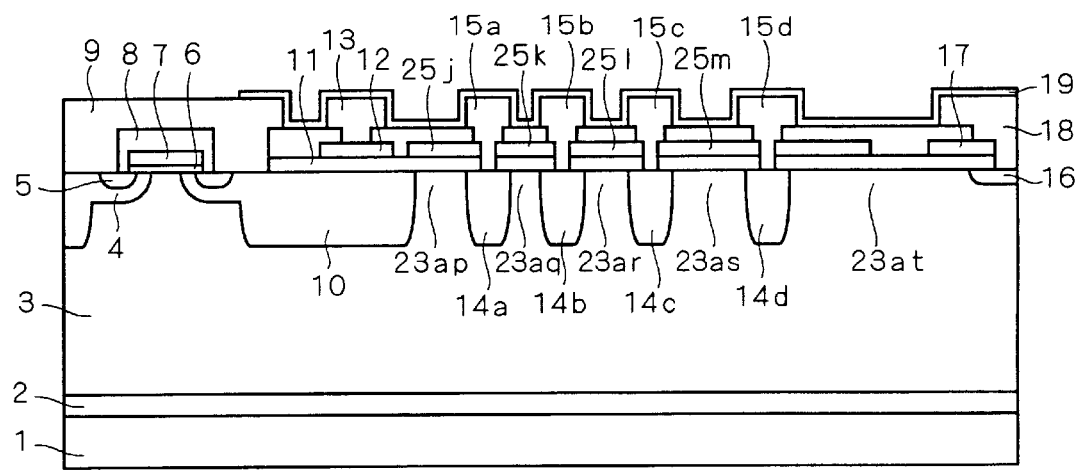
FIG. 37 is a cross-sectional view showing the power semiconductor device according to the thirteenth preferred embodiment.

FIG. 35 is a plane view showing a power semiconductor device according to a thirteenth preferred embodiment of the present invention, FIG. 36 is a partially enlarged plane view thereof and FIG. 37 is a cross-sectional view thereof. Elements having the same functions as those in the first to fourth background arts and the first to twentieth preferred embodiments are designated by the same reference numerals in FIGS. 35 to 37.

The power semiconductor device of the present embodiment is applied to the outer peripheral structure of a vertical power device. FIGS. 35 to 37 illustrate polysilicon shields 25j to 25m, the shielding Al electrodes 15a to 15d electrically connected to the guard rings 14a to 14d and impurity substrate surfaces 23ap to 23at of low concentration having the first conductivity type (n-type).

As shown in FIG. 37, the polysilicon shields 25k to 25m are electrically connected to the guard rings 14a to 14d adjacent to each other under the respective ends of the shields 25k to 25m through the shielding Al electrodes 15a to 15d, respectively.

The polysilicon shields 25j to 25m respectively cover the substrate surfaces 23ap to 23as provided adjacent to the guard rings 14a to 14d throughout the peripheries of the guard rings 14a to 14d.

As described, the polysilicon shields 25j to 25m cover the substrate surfaces 23ap to 23as, respectively, in the power semiconductor device of the present embodiment. In other words, the surface state of the substrate surfaces 23ap to 23as is determined only by the potentials of the polysilicon shields 25j to 25m, respectively, having the potential gradient of the guard rings 14a to 14d provided adjacent to the substrate surfaces 23ap to 23as, eliminating the influence of external charges such as polarization in the mold (cf. 21 in FIG. 61) over the passivation film 19. Thus, appropriate potential design in the chip allows the power semiconductor device to be insensitive to polarization in the mold (cf. 21 in FIG. 61) over the passivation film 19.

For the polysilicon shields 25j to 25m in this power semiconductor device, a polysilicon resistor (high-resistive polysilicon) of low concentration or multistage polysilicon diode (reverse-biased diode) of Back-To-Back type may be employed, for example.

When a polysilicon resistor of low concentration is employed for the polysilicon shields 25j to 25m, voltage design of the innermost and outermost substrate surfaces 23ap and 23at is performed, following which a resistance value may be set at such a maximum value that an amount of charges can flow in unit time which is greater than that in the polarization in the mold (cf. 21 in FIG. 61) over the passivation film 19 stored in the same unit time under desired service conditions.

Alternatively, a multistage polysilicon diode of Back-To-Back type may be employed for the polysilicon shields 25j to 25m. In this case, voltage design for the innermost and outermost substrate surfaces 23ap and 23at is performed, following which the number of stages may be determined and set by the breakdown voltage of the polysilicon diode per stage (actually including a forward voltage drop of approximately 0.6V per stage), making this alternative easily feasible.

The method of manufacturing the power semiconductor device of the present embodiment is the same as that of the fourth preferred embodiment, explanation of which is thus omitted here.

<Fourteenth Preferred Embodiment>

Figure 38:
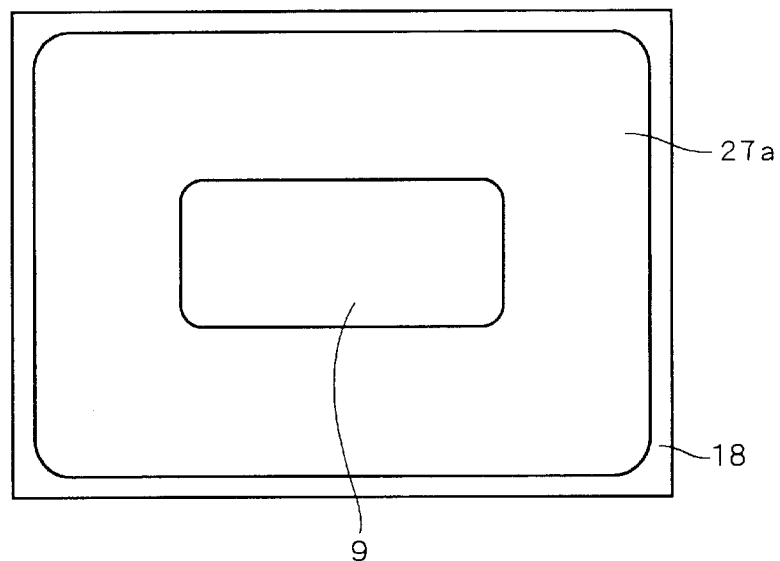
FIG. 38 is a plane view showing a power semiconductor device according to a fourteenth preferred embodiment of the present invention.
Figure 39:
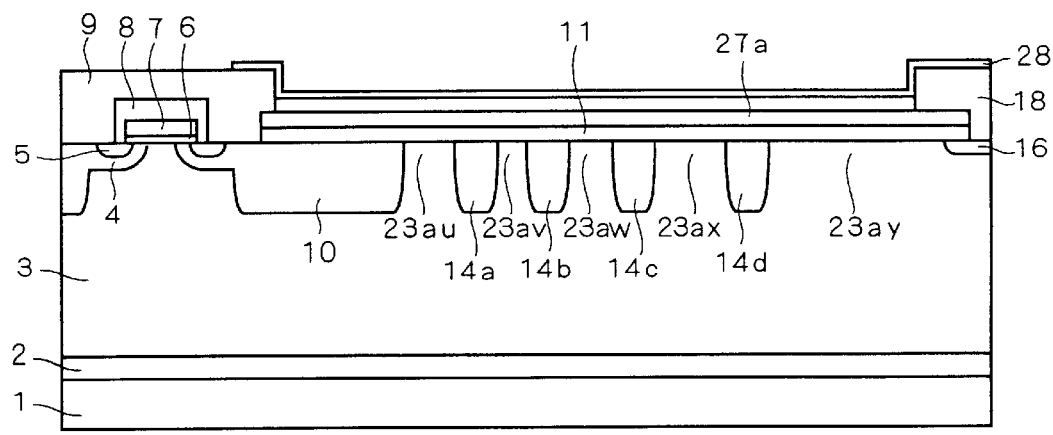
FIG. 39 is a cross-sectional view showing the power semiconductor device according to the fourteenth preferred embodiment.

FIG. 38 is a plane view showing a power semiconductor device according to a fourteenth preferred embodiment of the present invention, and FIG. 39 is a cross-sectional view thereof. Elements having the same functions as those in the first to fourth background arts and the first to thirteenth preferred embodiments are designated by the same reference numerals in FIGS. 38 and 39.

The power semiconductor device of the present embodiment is applied to the outer peripheral structure of a vertical power device. FIGS. 38 and 39 show a polysilicon Zener diode (polysilicon shield) 27a as a multistage-coupled reverse-biased diode of Back-To-Back type formed over almost the entire surface of the outer peripheral portion so as to cover the guard rings 14a to 14d and impurity substrate surfaces 23au and 23av to 23ay of low concentration having the first conductivity type interposed between the guard rings 14a to 14d, respectively. The diode 27a is connected to the emitter electrode 9 at its inner periphery and to the channel stopper 16 as a polysilicon electrode at its outer periphery.

The guard rings 14a to 14d are not electrically connected to the polysilicon Zener diode 27a.

Since the channel stopper 16 has an almost equal potential to the collector potential, the polysilicon Zener diode 27a is set at the emitter potential and the collector potential at its inner periphery and outer periphery, respectively. Thus, the diode 27a has a potential gradient from its center to outer periphery.

Setting the diode 27a at such resistivity as to cancel out external charges caused by the polarization in the mold (cf. 21 in FIG. 61) over the passivation film 19 and the like prevents the substrate surfaces 23au to 23ay from being affected by such polarization, which thus can provide a power semiconductor device insensitive to external service conditions and the like.

The polysilicon Zener diode 27a of this power semiconductor device may be substituted by polysilicon of low concentration (high-resistive polysilicon), for example, similarly to the thirteenth preferred embodiment.

<Fifteenth Preferred Embodiment>

Figure 40:
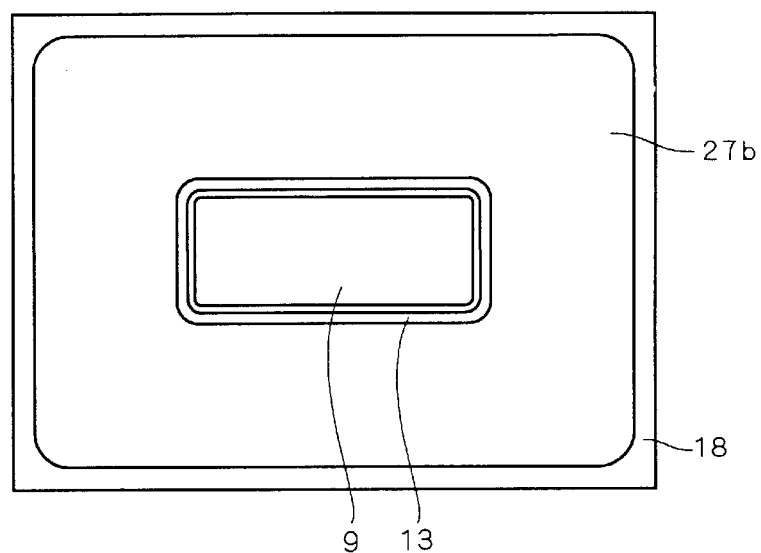
FIG. 40 is a plane view showing a power semiconductor device according to a fifteenth preferred embodiment of the present invention.
Figure 41:
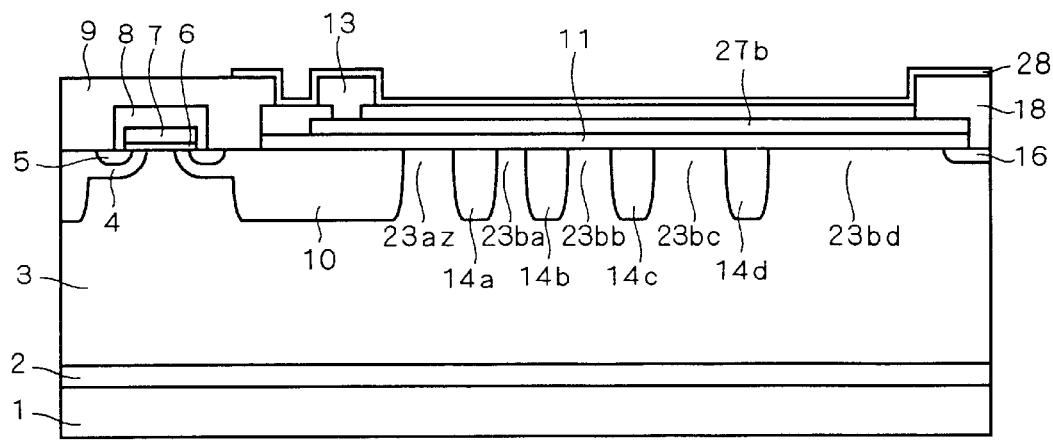
FIG. 41 is a cross-sectional view showing the power semiconductor device according to the fifteenth preferred embodiment.

FIG. 40 is a plane view showing a power semiconductor device according to a fifteenth preferred embodiment of the present invention, and FIG. 41 is a cross-sectional view thereof. Elements having the same functions as those in the first to fourth background arts and the first to fourteenth preferred embodiments are designated by the same reference numerals in FIGS. 40 and 41.

The power semiconductor device of the present embodiment is applied to the outer peripheral structure of a vertical power device and has the same structure as that of the fourteenth preferred embodiment in that, as shown in FIGS. 40 and 41, a polysilicon Zener diode (polysilicon shield) 27b is formed over almost the entire surface of the outer peripheral portion so as to cover the guard rings 14a to 14d and substrate surfaces 23az to 23bd, and is connected to the channel stopper 16 as a polysilicon electrode at its outer periphery. However, the diode 27b is connected to the gate electrode 13 at its inner periphery different from the fourteenth preferred embodiment.

As described, the polysilicon Zener diode 27b is set at the emitter potential and the collector potential at its inner periphery and outer periphery, respectively, by means of the channel stopper 16. Thus, the diode 27b has a potential gradient from its center to outer periphery.

When a voltage between the collector (channel stopper 16) and the emitter (emitter 5) is sufficiently greater than that between the gate (gate electrode 13) and the emitter (emitter 5), the same effects as those in the fourteenth preferred embodiment can be obtained.

The polysilicon Zener diode 27b is set such that the voltage between the collector (channel stopper 16) and the emitter (emitter 5) is maintained at a predetermined level, similarly to the fourteenth preferred embodiment.

Further, the power semiconductor device of the present embodiment, in which the potential is set to gradually vary between the gate electrode 13 having the gate potential and the channel stopper 16 having substantially the collector potential, can be provided with the overvoltage protecting function at the time of sending a signal from outside to the gate electrode 13 in the case that the collector potential of the channel stopper 16 becomes overvoltage. As the simplest example, in which a resistor is provided between the gate (gate electrode 13) and the emitter (5), current flowing through the polysilicon Zener diode 27b is set at such a value that the product of current flowing through the diode 27b and a resistance between the gate (gate electrode 13) and emitter (5) when the gate-emitter voltage becomes a predetermined collector protection voltage exceeds a gate threshold value of a power device as the power semiconductor device, so that collector overvoltage protection can easily be performed.

<Sixteenth Preferred Embodiment>

Figure 42:
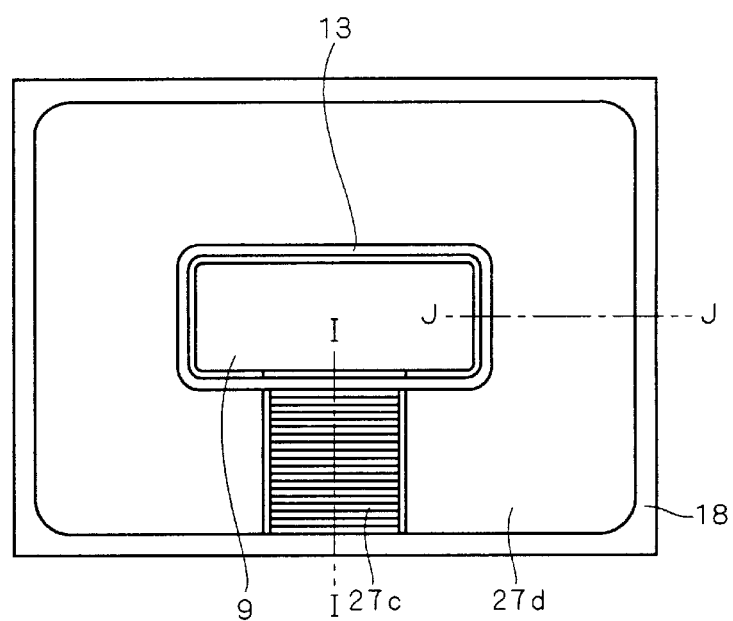
FIG. 42 is a plane view showing a power semiconductor device according to a sixteenth preferred embodiment of the present invention.
Figure 43:
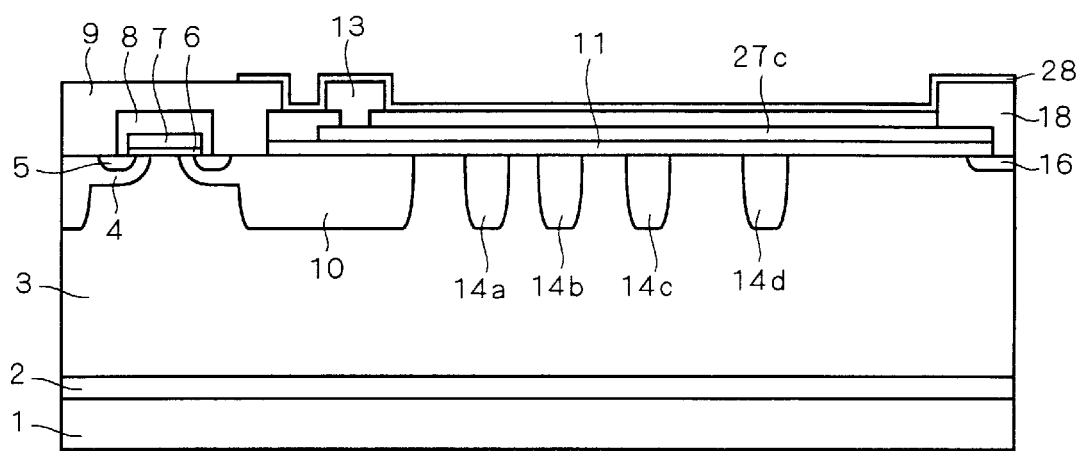
FIG. 43 is a cross-sectional view taken along the line I—I of FIG. 42.
Figure 44:
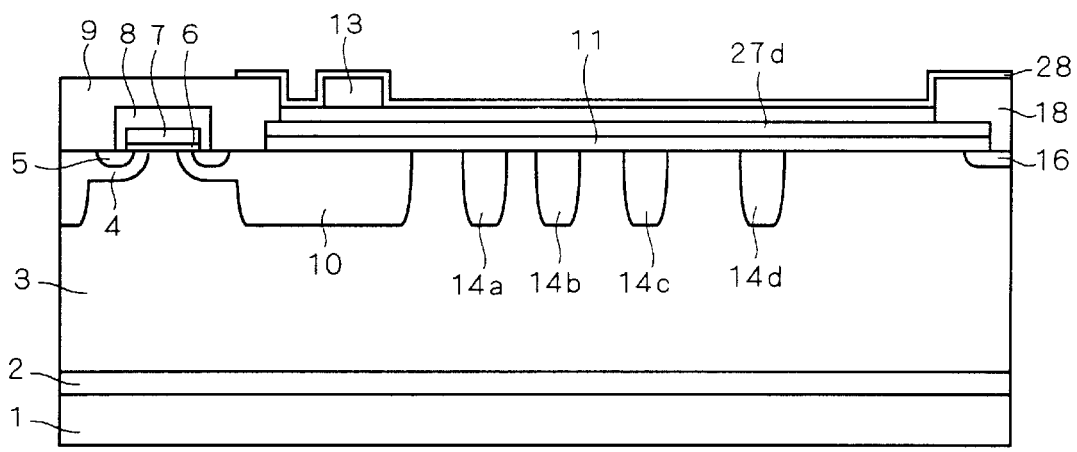
FIG. 44 is a cross-sectional view taken along the line J—J of FIG. 42.

FIG. 42 is a plane view showing a power semiconductor device according to a sixteenth preferred embodiment of the present invention, and FIGS. 43 and 44 are cross-sectional views taken along the lines I—I and J—J of FIG. 42, respectively. Elements having the same functions as those in the first to fourth background arts and the first to fifteenth preferred embodiments are designated by the same reference numerals in FIGS. 41 to 43.

As shown in FIGS. 42 and 43, the power semiconductor device is partly provided with a polysilicon Zener diode (polysilicon shield) 27c of certain width. The diode 27c has one end connected to the gate electrode 13 and the other end connected to the channel stopper 16 (collector).

The power semiconductor device is further provided with a polysilicon Zener diode 27d as shown in FIGS. 42 and 44 at its outer peripheral portion other than a portion connected to the polysilicon Zener diode 27c. The diode 27d has one end connected to the emitter electrode 9 and the other end connected to the channel stopper 16 (collector).

These polysilicon Zener diodes 27c and 27d are each made of a multistage polysilicon diode (reverse-biased diode) of Back-To-Back type. The number of stages of the diode 27c is set such that a protection signal is generated at a desired collector voltage, and the diode 27d is set to have a somewhat high breakdown voltage so as not to be broken down before the gate protection signal is generated.

According to the power semiconductor device of such structure, the polysilicon Zener diodes 27c and 27d are capable of canceling out the influence of polarization in the mold (cf. 21 in FIG. 61) over the passivation film 19, while the diode 27c allows a feedback circuit device for overvoltage protection to be made on-chip.

Further, setting the width of the diodes 27c and 27d for gate feedback allows easy setting of a current value for feedback. This results in easy design, which allows setting at minimum current consumption, for example.

<Seventeenth Preferred Embodiment>

Figure 45:
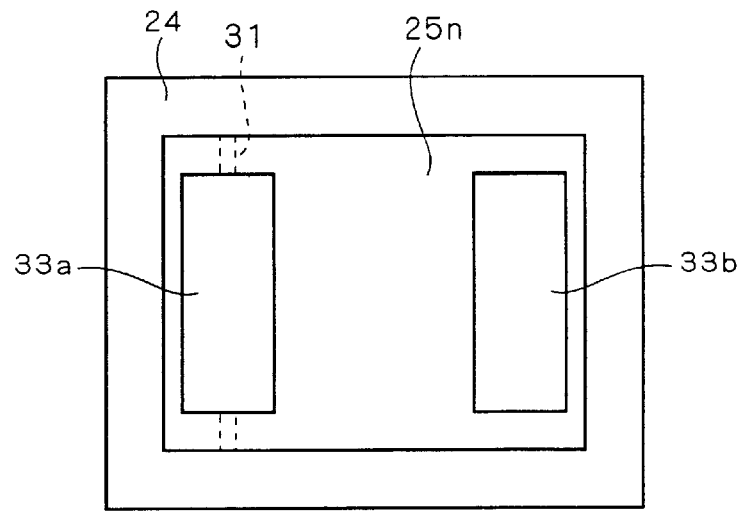
FIG. 45 is a plane view showing a power semiconductor device according to a seventeenth preferred embodiment of the present invention.
Figure 46:
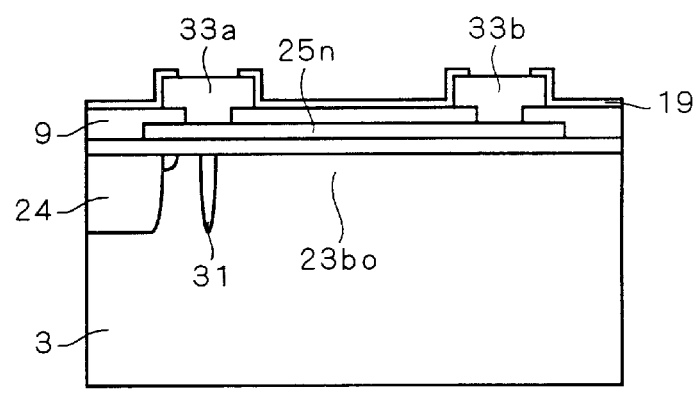
FIG. 46 is a cross-sectional view showing the power semiconductor device according to the seventeenth preferred embodiment.

FIG. 45 is a plane view showing a power semiconductor device according to a seventeenth preferred embodiment of the present invention, and FIG. 46 is a cross-sectional view thereof. Elements having the same functions as those in the first to fourth background arts and the first to sixteenth preferred embodiments are designated by the same reference numerals in FIGS. 45 and 46.

In this power semiconductor device, in the case that an impurity substrate surface 23bo of low concentration having the first conductivity type (n−) and the impurity region 24 are provided adjacent to each other in the surface of the n− substrate 3, on which a high-potential region (high-potential polysilicon electrode 33a to be described later) is formed with the field oxide film 11 interposed therebetween, a polysilicon shield 25n is provided between the field oxide film 11 and the high-potential region 33a, and a p+ slit region 31 of high concentration is formed in the n− substrate 3 under the high-potential region 33a separately from the junction of the substrate surface 23bo and the impurity region 24.

Specifically, FIGS. 45 and 46 illustrate the high-potential polysilicon shield 25n, high-potential polysilicon electrodes 33a and 33b, the substrate surface 23bo of the n-substrate 3, the impurity region 24 and the slit region 31.

In this power semiconductor device, the slit region 31 is only formed immediately under the polysilicon electrode 33a, and the slit region 31 and the impurity region 24 are spaced at a certain distance such that the slit region 31 is electrically separated from the impurity region 24.

The polysilicon shield 25n, being connected to both the polysilicon electrodes 33a and 33b, shall have a higher potential than the substrate 3, and the polysilicon electrode 33b shall have a higher potential than the other electrode 33a.

As shown in FIGS. 45 and 46, an end of the polysilicon shield 25n is arranged over the junction of the substrate 3 and the impurity region 24, so that the substrate surface has a potential distribution in which the potential varies in the horizontal direction from the substrate 3 to the impurity region 24 under the influence of the polysilicon shield 25n of high potential. Thus, an electric field at the junction of the substrate 3 and the impurity region 24 is intensified as compared to the case that the end of the shield 25n is not extended over the junction of the substrate 3 and the impurity region 24. This causes a disadvantage that the breakdown voltage at the junction of the substrate 3 and the impurity region 24 is reduced.

In the power semiconductor device of the present embodiment, however, the slit region 31, provided immediately under the polysilicon shield 25n, i.e., in the vicinity of the junction of the substrate 3 and the impurity region 24, allows the reducing electric field at the junction of the substrate 3 and the impurity region 24 in the horizontal direction to be leveled, so that a reduction in breakdown voltage at the junction can be suppressed.

In the manufacturing method of this power semiconductor device, the slit region 31 may be formed at the same time when the impurity region 24 is formed.

<Eighteenth Preferred Embodiment>

Figure 47:
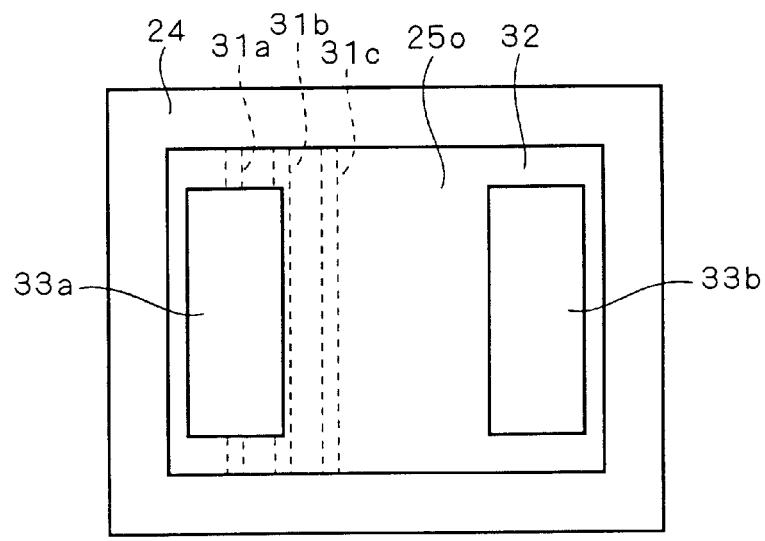
FIG. 47 is a plane view showing a power semiconductor device according to an eighteenth preferred embodiment of the present invention.
Figure 48:
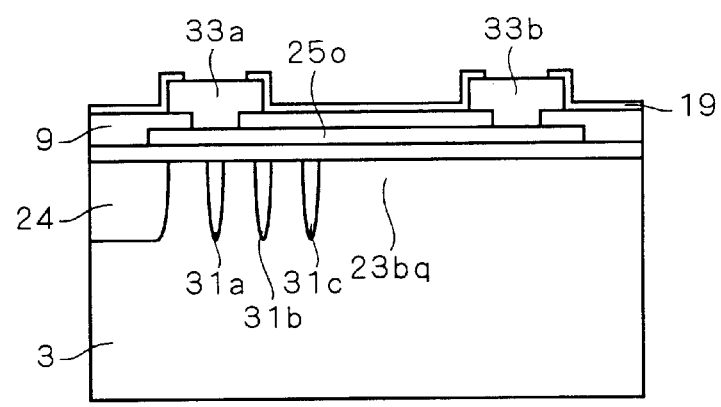
FIG. 48 is a cross-sectional view showing the power semiconductor device according to the eighteenth preferred embodiment.

FIG. 47 is a plane view showing a power semiconductor device according to an eighteenth preferred embodiment of the present invention, and FIG. 48 is a cross-sectional view thereof. Elements having the same functions as those in the first to fourth background arts and the first to seventeenth preferred embodiments are designated by the same reference numerals in FIGS. 47 and 48.

Different from the seventeenth preferred embodiment, the power semiconductor device of the present embodiment is provided with a plurality of p+ slit regions 31a to 31c of high concentration in the horizontal direction which are electrically separated from the impurity region 24 and are electrically separated from one another.

Such arrangement allows a depletion layer to be effectively extended to relax an electric field, thereby maintaining a high breakdown voltage.

The slit regions 31a to 31c are formed at the same time when the impurity region 24 is formed similarly to the seventeenth preferred embodiment.

<Nineteenth Preferred Embodiment>

Figure 49:
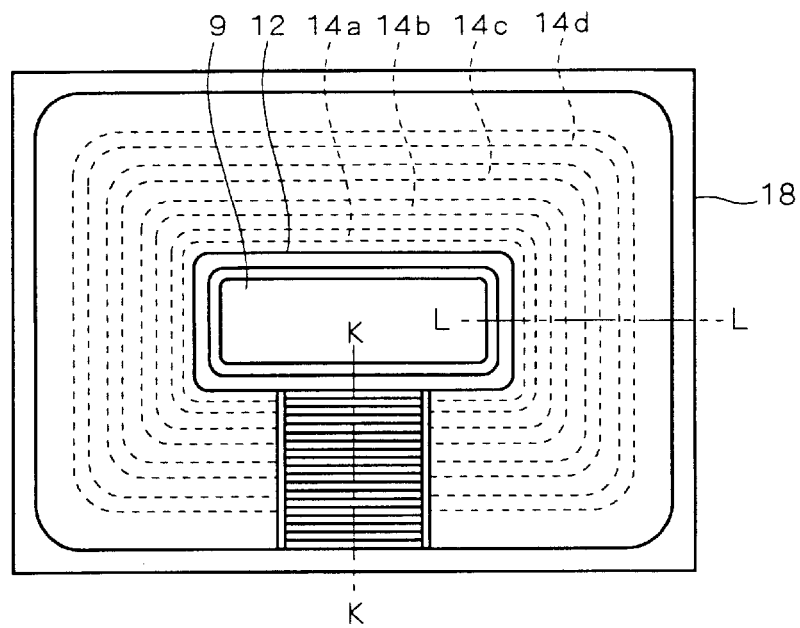
FIG. 49 is a plane view showing a power semiconductor device according to a nineteenth preferred embodiment of the present invention.
Figure 50:
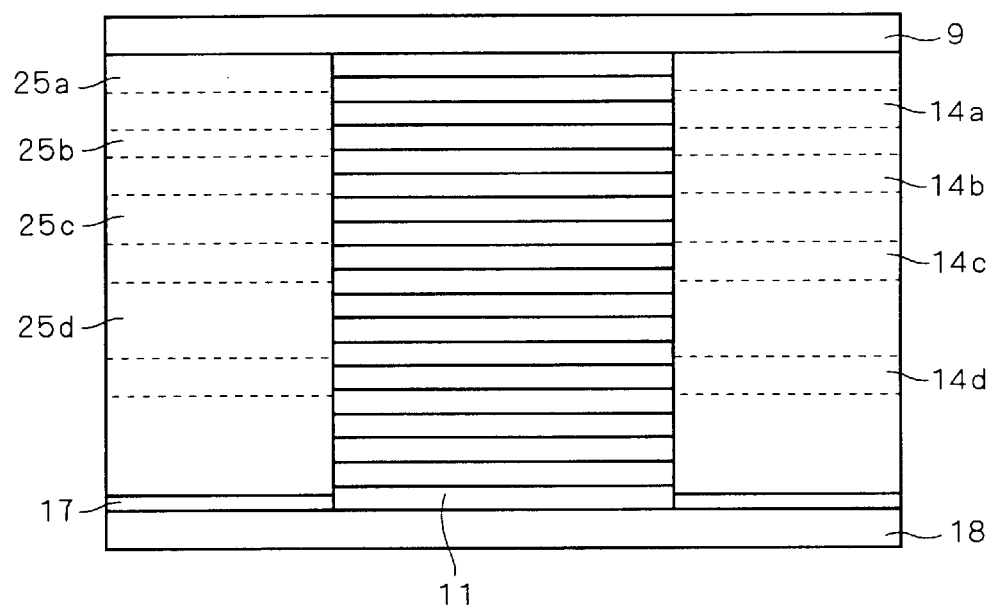
FIG. 50 is a partially enlarged plane view showing the power semiconductor device according to the nineteenth preferred embodiment.
Figure 51:
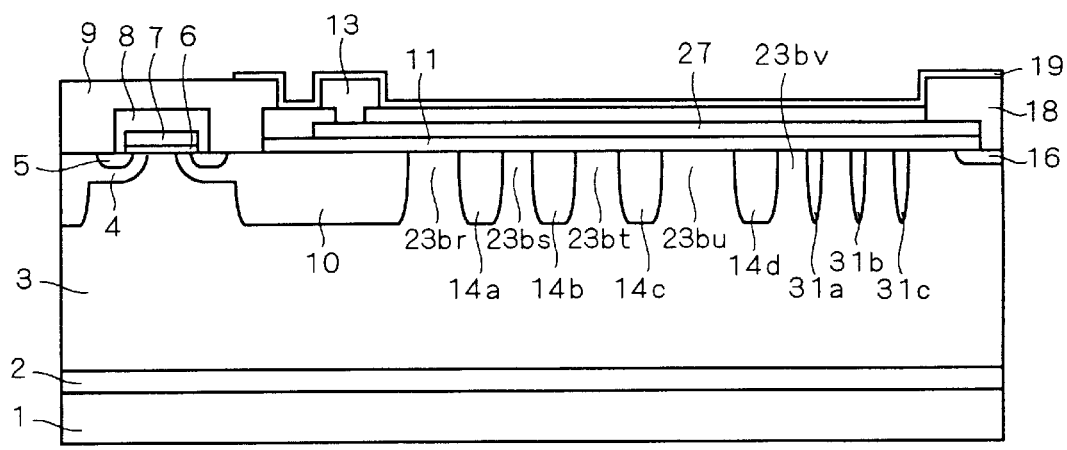
FIG. 51 is a cross-sectional view taken along the line K—K of FIG. 49.
Figure 52:
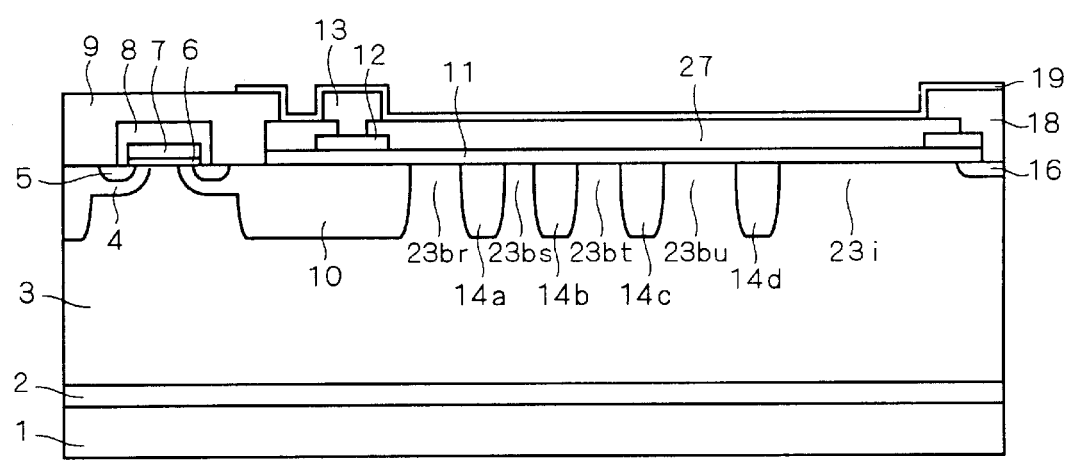
FIG. 52 is a cross-sectional view taken along the line L—L of FIG. 49.

FIG. 49 is a plane view showing a power semiconductor device according to a nineteenth preferred embodiment of the present invention, FIG. 50 is a partially enlarged plane view thereof, and FIGS. 51 and 52 are cross-sectional views taken along the lines K—K and L—L of FIG. 49. Elements having the same functions as those in the first to fourth background arts and the first to eighteenth preferred embodiments are designated by the same reference numerals in FIGS. 49 to 52. These drawings illustrate impurity substrate surfaces 23br to 23bu of low concentration having the first conductivity type.

The power semiconductor device of the present embodiment is applied to the outer peripheral structure of a vertical power device, in which the plurality of p+ slit regions 31a to 31c are provided only in the vicinity of the channel stopper ground electrode 18 immediately under the polysilicon Zener diode (reverse-biased diode) 27 as a multistage-coupled Zener diode. These slit regions 31a to 31c are electrically separated from the outermost guard ring 14d as a p+ region of high concentration and are electrically separated from one another.

Such arrangement allows a depletion layer to be effectively extended even when an electric field concentrates at the outermost guard ring 14d immediately under the diode 27 due to the polarization in the mold (cf. 21 in FIG. 61) over the passivation film 19, preventing deterioration in breakdown voltage.

The slit regions 31a to 31c, although provided only on the outer peripheral side with respect to the outermost guard ring 14d immediately under the diode 27 in the present embodiment, may be formed in the substrate surfaces 23bs to 23bu respectively interposed between the guard rings 14a to 14d provided in the middle part immediately under the diode 27 or the substrate surface 23br on the inner peripheral side with respect to the innermost guard ring 14a. This allows the electric field at each of the substrate surfaces 23br to 23bu is effectively relaxed when polarization occurs in the mold (cf. 21 in FIG. 61) over the passivation film 19.

<Twentieth Preferred Embodiment>

Figure 53:
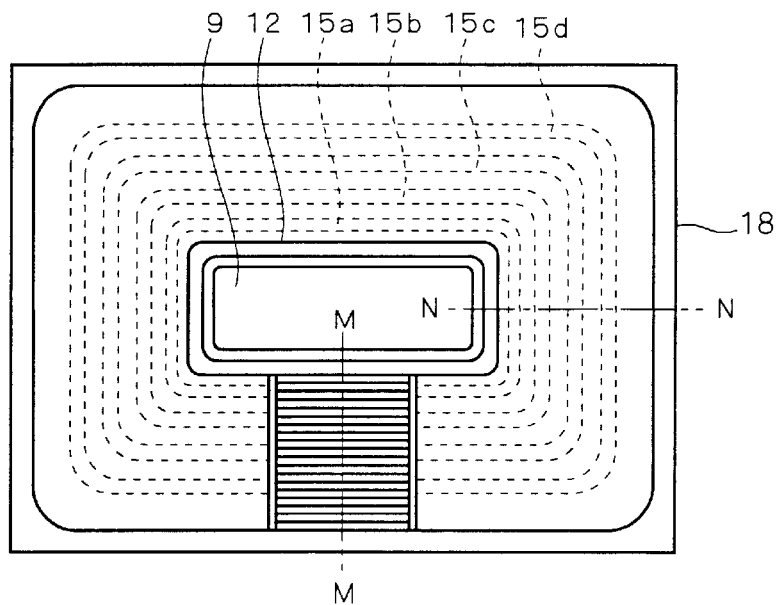
FIG. 53 is a plane view showing a power semiconductor device according to a twentieth preferred embodiment of the present invention.
Figure 54:
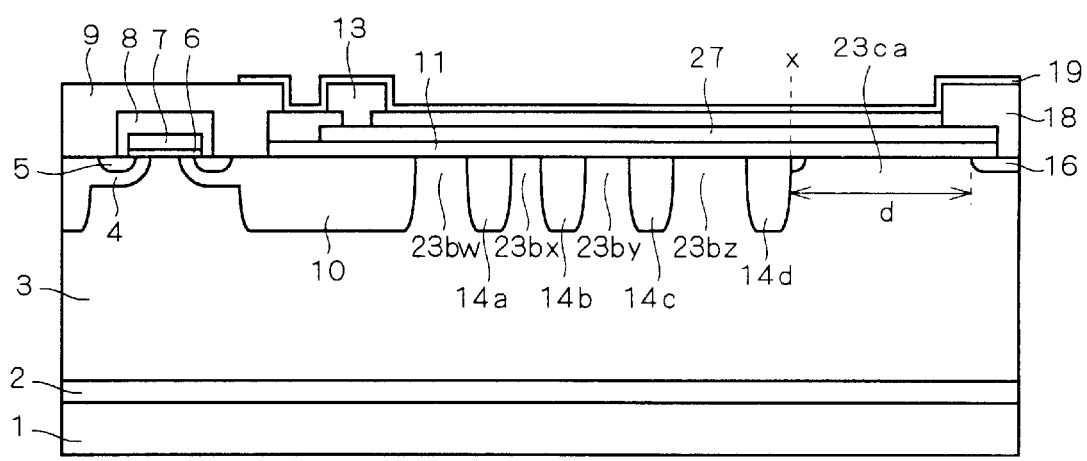
FIG. 54 is an example of a cross-sectional view taken along the line M—M of FIG. 53.
Figure 55:
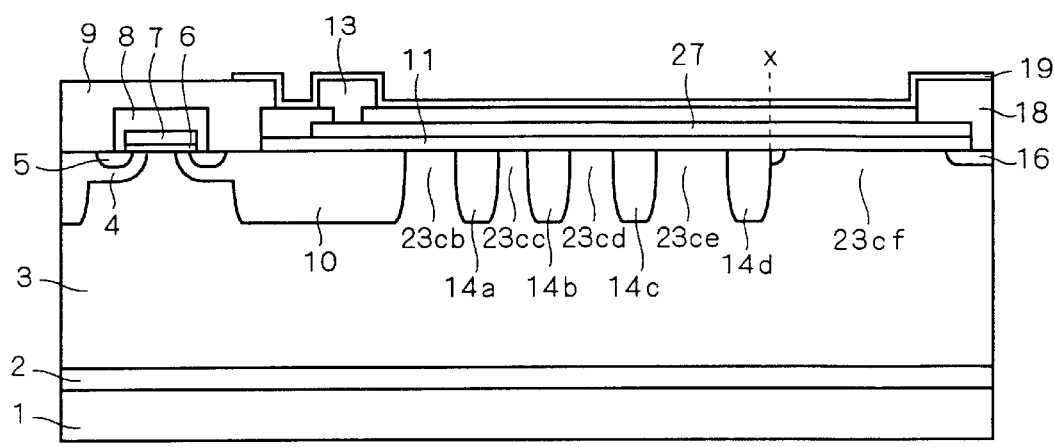
FIG. 55 is another example of the cross-sectional view taken along the line M—M of FIG. 53.
Figure 56:
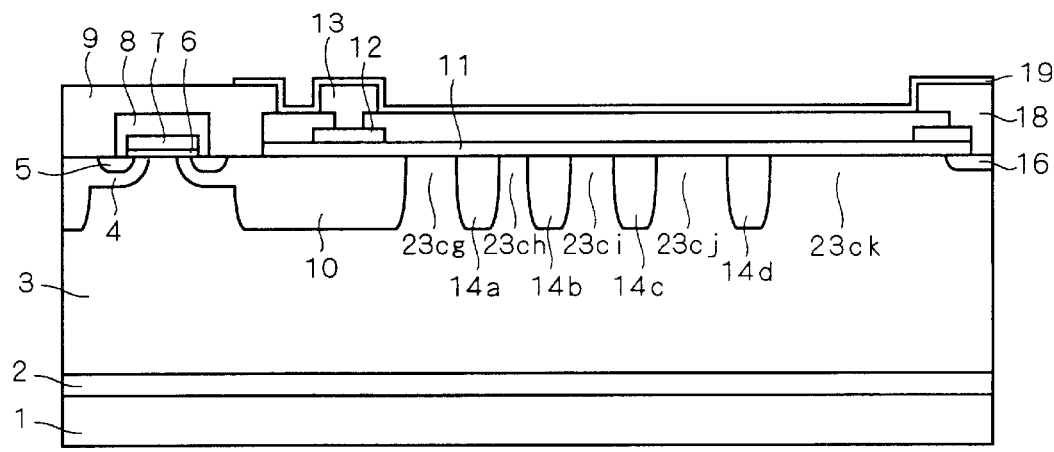
FIG. 56 is a cross-sectional view taken along the line N—N of FIG. 53.

FIG. 53 is a plane view showing a power semiconductor device according to a twentieth preferred embodiment of the present invention, FIG. 54 is an example of a cross-sectional view taken along the line M—M of FIG. 53, FIG. 55 is another example of the cross-sectional view taken along the line M—M of FIG. 53, and FIG. 56 is a cross-sectional view taken along the line N—N of FIG. 53. Elements having the same functions as those in the first to fourth background arts and the first to nineteenth preferred embodiments are designated by the same reference numerals in FIGS. 53 to 56.

The power semiconductor device is an IGBT having a clamp diode for protection formed between the gate and collector. The polysilicon Zener diode 27 is partly formed on the guard rings 14a to 14d of the outer peripheral structure. The diode 27, with its one end connected to the gate electrode 13 and the other end to the channel stopper ground electrode 18 as a collector, is used as a clamp diode for discharging current at the time of overcurrent to protect the power semiconductor device.

In a region where the Zener diode 27 is not formed, the guard rings 14a to 14d, substrate surfaces 23bw to 23ca (FIG. 54), 23cb to 23cf (FIG. 55) and 23cg to 23ck (FIG. 56) are exposed with the passivation film 19 and the field oxide film 11 provided thereon.

In designing the power semiconductor device, the whole size thereof is not changed but the guard rings 14a to 14d are changed in width, causing the position of the outermost guard ring 14d to be changed, as shown in FIGS. 54 and 56. In FIGS. 54 and 56, it is premised that the p+ isolation well 10 and the channel stopper 16 are spaced at a certain distance and that the polysilicon Zener diode 27 thus has a certain length.

Generally, when the influence of polarization in the mold (cf. 21 in FIG. 61) over the passivation film 19 is negligible, the guard rings 14a to 14d and the diode 27 provided thereover are matched in potential distribution. Thus, a desired breakdown voltage can be maintained in the power semiconductor device. However, when polarization occurs in the mold (cf. 21 in FIG. 61) over the passivation film 19, causing the potential of the substrate surface not to be maintained due to, for example, inversion at the substrate surfaces 23bw to 23ca (FIG. 54), 23cb to 23cf (FIG. 55) and 23cg to 23ck (FIG. 56), the guard rings 14a to 14d and the diode 27 provided thereover become unmatched in potential distribution. In this state, the diode 27 has a high potential at its upper portion, causing an electric field to be intensified at a region immediately under the outermost guard ring 14d as compared to other regions, which results in significant deterioration in breakdown voltage of the power semiconductor device.

Figure 57:
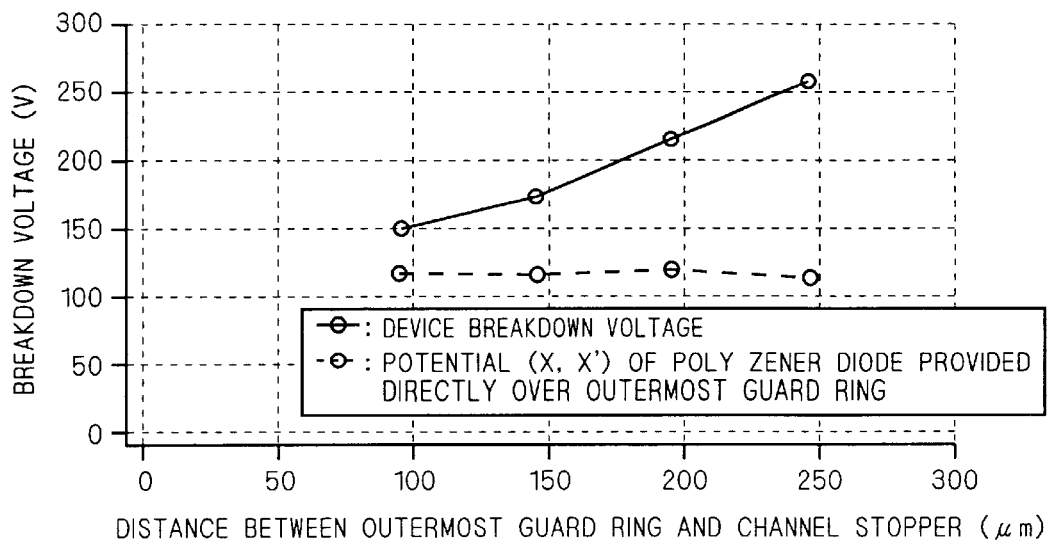
FIG. 57 is a graph showing the breakdown voltage maintained in a power semiconductor device and the potential of a polysilicon Zener diode at a point over the outer periphery of the outermost guard ring when strong polarization occurs in a mold over a passivation film.

FIG. 57 is a graph showing the breakdown voltage maintained in the power semiconductor device (in solid line) when great polarization occurs in the mold (cf. 21 in FIG. 61) over the passivation film 19 and the potential of the polysilicon Zener diode 27 (in broken line) at a point X above the outer periphery of the outermost guard ring 14d. The graph of FIG. 57 takes a spaced distance d (FIG. 54) from the point X to the channel stopper 16 as a parameter representing the position of the point X.

When polarization does not occur in the mold (cf. 21 in FIG. 61) over the passivation film 19, the guard rings 14a to 14d and the polysilicon Zener diode 27 are matched in potential distribution, so that the breakdown voltage of the power semiconductor device is a designed value (e.g., 300V) determined by the diode 27 that is a constant value, not depending upon the position of the point X above the outer periphery of the outermost guard ring 14d.

However, when polarization occurs in the mold (cf. 21 in FIG. 61) over the passivation film 19, decreasing the spaced distance d (i.e., bringing the point X closer to the channel stopper 16) reduces the breakdown voltage of the power semiconductor device, whereas increasing the spaced distance d (i.e., bringing the point X closer to the p+ isolation well 10) increases the breakdown voltage of the power semiconductor device.

For instance, the breakdown voltage is approximately 200V when the distance d is approximately 200 μm, whereas the breakdown voltage is reduced to approximately 150V in simulation when the distance d is approximately 100 μm.

However, the potential at the point X is approximately 120V in this case and hardly varies. In other words, setting the potential at the point X not to exceed this value 120V will allow a desired breakdown voltage to be maintained in the power semiconductor device even when polarization occurs in the mold (cf. 21 in FIG. 61) over the passivation film 19.

Figure 58:
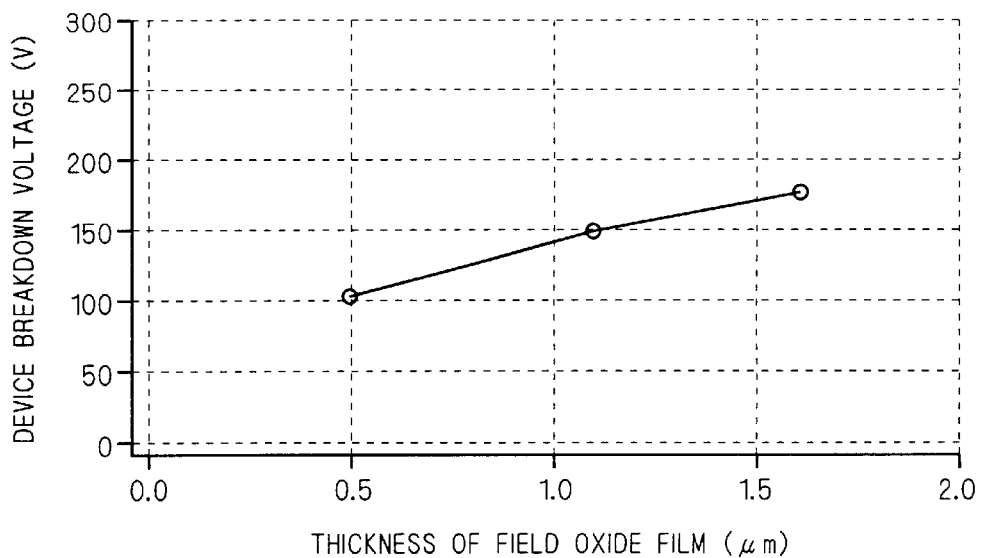
FIG. 58 is a graph showing the device breakdown voltage when a field oxide film is varied in thickness.
Figure 59:
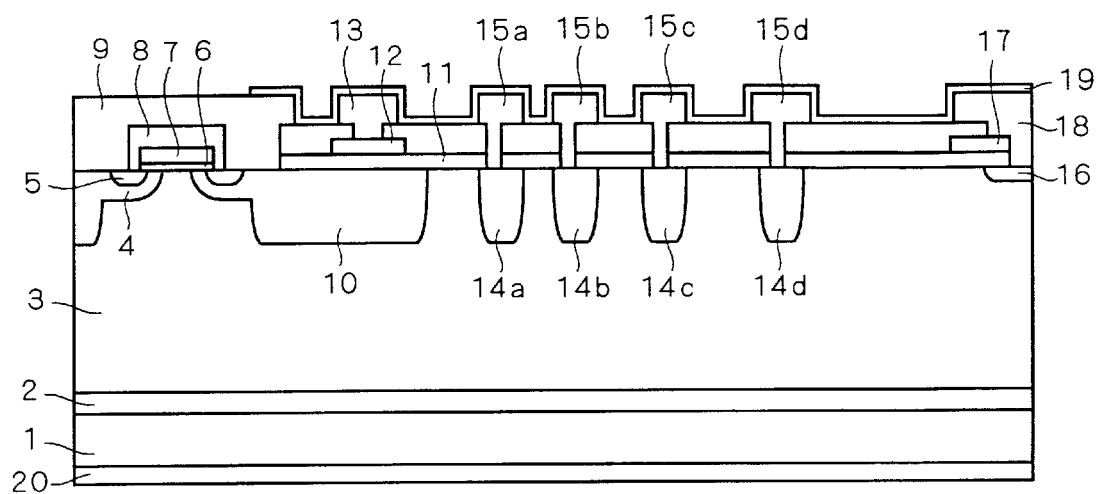
FIG. 59 is a sectional view showing a power semiconductor device according to a first background art.

FIG. 58 is a graph showing the device breakdown voltage when the field oxide film 11 is changed in thickness, provided that the distance d is constant. As shown in FIG. 58, as the field oxide film 11 is increased in thickness, the breakdown voltage that can be maintained in the power semiconductor device increases. When the field oxide film 11 is approximately 1.0 μm in thickness, a breakdown voltage of approximately 150V can be obtained in the structure simplified by simulation where strong polarization occurs in the mold (cf. 21 in FIG. 61) over the passivation film 19.

The following equation (2) expresses approximation of linearization of the solid line shown in FIG. 58.

$$Vx=54.2\times T+58.2(V) \tag{2}$$

Consequently, provided that the field oxide film 11 has a thickness T, setting the outermost periphery of the outermost guard ring 14d at such a position that the potential of the guard ring 14d at its outermost periphery to be not greater than the value Vx expressed in the equation (2) will cause no deterioration in breakdown voltage in the power semiconductor device even when polarization occurs in the mold (cf. 21 in FIG. 61) over the passivation film 19.

The result of measurements actually performed by the inventors of the present invention at a breakdown voltage of 150V under the same conditions as the simulation showed that the potential Vx of the polysilicon Zener diode 27 was approximately 200V. Thus, the inventors have found that the breakdown voltage of the power semiconductor device can be prevented from deteriorating with respect to an insured voltage under the condition as indicated by the following equation (3).

$$Vx=72.3\times T+77.6(V) \tag{3}$$

Using the equation (3), the potential Vx of the diode 27 may be set to be not greater than approximately 150V when the thickness T of the field oxide film 11 shall be approximately 1.0 μm, for example. Thus, in a power semiconductor device having a breakdown voltage of 300V, setting the point X above the outer periphery of the outermost guard ring 14d at almost the center of the diode 27 allows a desired breakdown voltage to be maintained even when polarization occurs in the mold (cf. 21 in FIG. 61) over the passivation film 19.

Actually, the polarization in the mold (cf. 21 in FIG. 61) over the passivation film 19, by which charges are stored due to continuation of a high-temperature high-field state (high-temperature Off state), gradually affects the substrate surface. However, the influence of polarization varies depending on the material of the mold (cf. 21 in FIG. 61) over the passivation film 19, and the breakdown voltage, even if deteriorates, does not necessarily deteriorate to the limit. Thus, applying the above-described structure aiming at perfection causes wastage in efficiency of chip area.

As secondary measures, by setting the potential Vx of the diode 27 such that the breakdown voltage does not deteriorate down to a supply voltage or below, thermal runaway does not occur in an Off state, so that device breakdown due to thermal runaway can sufficiently be avoided. In other words, designing may be performed so as to satisfy the equations (2) and (3) at the time of applying a supply voltage.

When the device operates at a supply voltage of 200V, for example, designing the point X to be positioned on the inner peripheral side with respect to the position of about three-quarters the length of the polysilicon Zener diode 27 from the outer peripheral side allows device breakdown due to thermal runaway to be suppressed to a minimum.

Description has been made on various preferred embodiments, however, the present invention is not limited to these embodiments, but may be applied to another structure, or the structures of the respective embodiments may be combined together.

Figure 60:
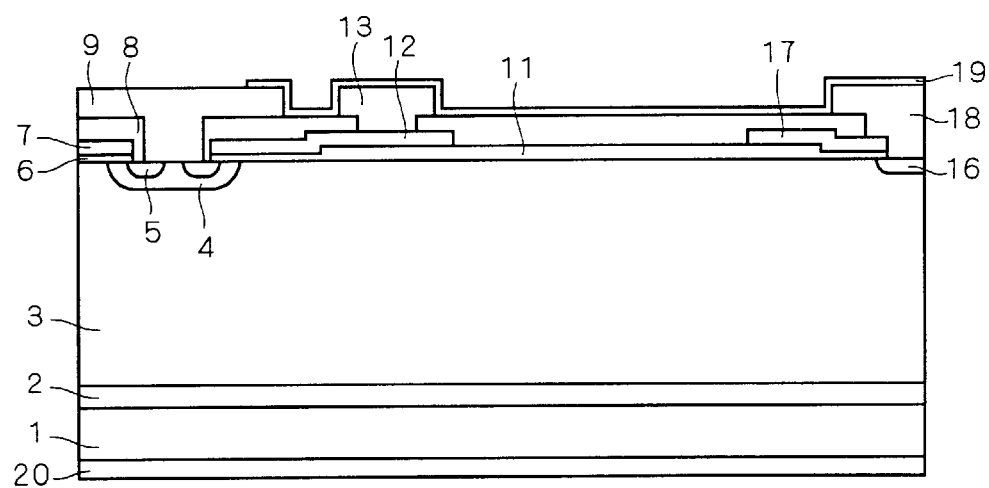
FIG. 60 is a sectional view showing a power semiconductor device according to a second background art.

For instance, some of the preferred embodiments have been described as having the same structure as the guard ring structure according to the first background art, however, the field plate structure according to the second background art shown in FIG. 60 may alternatively be applied thereto. In this case, the structure between the channel dope 4 and the channel stopper 16 may be substituted by that between the outermost guard ring 14d and the channel stopper 16 as described in the sixth preferred embodiment.

Moreover, the structure of the fourth preferred embodiment in which the polysilicon shields 25a to 25d are connected to the guard rings 14a to 14d on the outer peripheral side (higher potential side) and that of the fifth preferred embodiment in which the polysilicon shields 25f to 25i are connected to the guard rings 14a to 14d on the inner peripheral side (lower potential side) may be combined. Connecting the polysilicon shields 25a to 25d to either side of the higher potential side or lower potential side can achieve the effect of eliminating the influence of polarization in the mold (cf. 21 in FIG. 61) over the passivation film 19. To which side the polysilicon shields 25a to 25d are connected, the higher potential side or lower potential side, may be determined based on the polarity of the substrate 3 and the breakdown voltage properties determined by the substrate 3, the polysilicon shields 25a to 25i and the polysilicon plate (field plate) 17.

Further, it is needless to say that a better effect can be achieved combining the effect of the polysilicon shields 25a to 25d in the seventh preferred embodiment and the potential setting conditions for the outermost guard ring 14d in the twentieth preferred embodiment.

Furthermore, the above preferred embodiments each have been described as mainly being applied to an IGBT, however, they may be applied to a typical MOSFET, bipolar transistor, another IC having a similar outer peripheral structure or the like.

Still further, the first and second conductivity types have been described as n and p types, respectively, in the respective preferred embodiments, however, they may alternatively be p and n types, respectively.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device comprising:

an impurity substrate surface of low concentration having a first conductivity type formed in a predetermined region of a substrate surface;

an impurity region of high concentration having a second conductivity type formed in said substrate surface adjacent to said impurity substrate surface;

a conductor formed over said substrate surface to be insulated from said impurity substrate surface;

a conductive shield formed to include at least part of a region over said impurity substrate surface other than a region where said conductor is formed and to include a region overlapping a boundary region between said impurity substrate surface and said impurity region, said conductive shield being formed over, but not directly contacting, said impurity substrate surface and said impurity region with a predetermined insulation film interposed therebetween, at least part of said conductive shield being connected to said conductor; and an electrode in contact with said conductive shield and comprised of a different compound than said conductive shield.

2. The power semiconductor device according to claim 1, further comprising:

a conductive element arranged in the vicinity of said conductive shield leaving a space therebetween and being electrically insulated from said conductive shield; and another shield formed in the vicinity of said conductive element to be connected to said conductive shield and to be electrically insulated from said conductive element, extending from said boundary region between said impurity substrate surface and said impurity region to said conductive shield.

3. A power semiconductor device, comprising:

a semiconductor element region including a first impurity region of high concentration having a second conductivity type, formed in a substrate surface of a first conductivity type;

a second impurity region of high concentration having said first conductivity type spaced from said semiconductor element region along said substrate surface;

a floating electrode connected to said second impurity region;

one or more third impurity regions of high concentration having said second conductivity type for maintaining breakdown voltage formed in said substrate surface between said first and second impurity regions;

a shielding electrode connected to at least one of said one or more third impurity regions; and at least one conductive shield formed over and in contact with at least one of: a region interposed between one of said one or more third impurity regions most adjacent to said semiconductor element region and said first impurity region; a region interposed between said one or more third impurity regions; and a region interposed between said second impurity region and one of said one or more third impurity regions most adjacent to said second impurity region, said at least one conductive shield including regions overlapping boundary regions between said first impurity region, said second impurity region and said one or more third impurity regions, with a predetermined insulation film provided between said at least one conductive shield and at least one of said substrate surface, said first impurity region, said one or more third impurity regions and said second impurity region, said at least one conductive shield being connected to said shielding electrode.

4. The power semiconductor device according to claim 3, wherein an end of said at least one conductive shield is connected to said shielding electrode adjacent to said end.

5. The power semiconductor device according to claim 3, wherein said shielding electrode including a plurality of shielding electrodes, and said at least one conductive shield is connected to one of said shielding electrodes adjacent to both sides of said at least one conductive shield that has a higher potential.

6. The power semiconductor device according to claim 3, wherein said shielding electrode including a plurality of shielding electrodes, and said at least one conductive shield is connected to one of said shielding electrodes adjacent to both sides of said at least one conductive shield that has a lower potential.

7. The power semiconductor device according to claim 3, further comprising:

a predetermined semiconductor member electrically insulated from said at least one conductive shield; and a plurality of conductive members connected to said at least one conductive shield and formed to cover a region between said semiconductor member and said at least one conductive shield.

8. The power semiconductor device according to claim 3, wherein
said at least one conductive shield is connected to a terminal of said semiconductor element region.

9. The power semiconductor device according to claim 1, further comprising
a high-insulative passivation film for surface protection formed at least on an upper surface of said at least one conductive shield.

10. The power semiconductor device according to claim 9, further comprising
a polysilicon element serving as a high-resistive impurity region of low concentration formed in the vicinity of said passivation film.

11. The power semiconductor device according to claim 9, wherein
said at least one conductive shield can have a potential distribution therein and is connected to electrodes having different potentials from each other, respectively, at a plurality of positions spaced from each other.

12. The power semiconductor device according to claim 3, further comprising:
a high-insulative passivation film for surface protection formed at least on an upper surface of said at least one conductive shield; and
a polysilicon element serving as a high-resistive impurity region of low concentration formed in the vicinity of said passivation film, wherein
said at least one conductive shield can have a potential distribution therein and is connected to two of said plurality of shielding electrodes adjacent on both sides having different potentials from each other.

13. The power semiconductor device according to claim 11 or claim 12, wherein
said at least one conductive shield is selected from the group consisting of a shield formed of reverse-biased diode.

14. The power semiconductor device according to claim 11 or claim 12, wherein
said at least one conductive shield is selected from the group consisting of a shield formed of high-resistive resistor.

15. A power semiconductor device comprising:
an impurity substrate surface of low concentration having a first conductivity type formed in a predetermined region of a substrate surface;
an impurity region of high concentration having a second conductivity type formed in said substrate surface adjacent to said impurity substrate surface;
an insulation film formed on upper surfaces of said impurity substrate surface and said impurity region;
a shield formed on an upper surface of said insulation film, extending from a region over at least part of said impurity substrate surface to a region over a junction of said impurity substrate surface and said impurity region;
a high-potential region formed on part of an upper surface of said shield; and
at least one slit region of high concentration having said second conductivity type formed in said substrate surface under said high-potential region to be spaced and electrically separated from a junction of said impurity substrate surface and said impurity region along said substrate surface.

16. The power semiconductor device according to claim 15, further comprising:
a plurality of impurity regions of high concentration having said second conductivity type formed in said substrate surface intermittently along said substrate surface such that a potential gradient can be generated along said substrate surface; and
a multistage-coupled Zener diode provided along said potential gradient, wherein
said at least one slit region is electrically separated from said impurity regions and provided in parallel to part of said impurity regions and only under said Zener diode.

17. The power semiconductor device according to claim 16, wherein
said impurity regions are guard rings provided almost annularly around a predetermined semiconductor element along said substrate surface, and
said at least one slit region is provided on an outer peripheral side with respect to said guard rings.

18. A power semiconductor device, comprising:
an impurity substrate surface of low concentration having a first conductivity type formed in a predetermined region of a substrate surface;
a predetermined semiconductor element formed in part of said substrate surface;
a plurality of guard rings of almost annular shape serving as impurity regions of high concentration having a second conductivity type formed intermittently along said substrate surface such that a potential gradient can be generated along said substrate surface and centered at said predetermined semiconductor element;
an insulation film formed on upper surfaces of said impurity substrate surface and said plurality of guard rings;
a predetermined semiconductor member formed on an upper surface of said insulation film, extending from a region over at least part of said impurity substrate surface to a region over a junction of said impurity substrate surface and said impurity region; and
a high-potential region formed on part of an upper surface of said predetermined semiconductor member on an outer peripheral side with respect to an outermost one of said plurality of guard rings, wherein
when said insulation film has a thickness T, an outermost peripheral position of said outermost one of said plurality of guard rings is determined such that a difference between a potential in said outermost peripheral position and that of said high-potential region provided thereover is not greater than a value Vx obtained by the following equation:

$$V_x = 72.3 \times T + 77.6.$$

19. The power semiconductor device according to claim 18, wherein
said outermost peripheral position of said outermost one of said plurality of guard rings is determined such that said potential of said high-potential region provided over said outermost one of said plurality of guard rings is not greater than said value Vx.

20. A power semiconductor device, comprising:
a semiconductor element region including a first impurity region of high concentration having a second conductivity type, formed in a substrate surface of a first conductivity type;

a second impurity region of high concentration having said first conductivity type spaced from said semiconductor element region along said substrate surface;

a floating electrode connected to said second impurity region; and at least one conductive shield formed over a region interposed between said first and second impurity regions and formed to include a region overlapping a region spanning between said first and second impurity regions in said substrate surface, said at least one conductive shield being formed over said substrate surface and said first and second impurity regions with a predetermined insulation film interposed therebetween and being connected to said floating electrode or said terminal.

21. A power semiconductor device comprising:

an impurity substrate surface of low concentration having a first conductivity type formed in a predetermined region of a substrate surface;

an impurity region of high concentration having a second conductivity type formed in said substrate surface adjacent to said impurity substrate surface;

a conductor formed over said substrate surface to be insulated from said impurity substrate surface; and a conductive shield formed to include at least part of a region over said impurity substrate surface other than a region where said conductor is formed and to include a region overlapping a boundary region between said impurity substrate surface and said impurity region, said conductive shield being formed over said impurity substrate surface and said impurity region with a predetermined insulation film interposed therebetween, at least part of said conductive shield being connected to said conductor.

22. The power semiconductor device according to claim 21, further comprising:

a conductive element arranged in the vicinity of said conductive shield leaving a space therebetween and being electrically insulated from said conductive shield; and another shield formed in the vicinity of said conductive element to be connected to said conductive shield and to be electrically insulated from said conductive element, extending from said boundary region between said impurity substrate surface and said impurity region to said conductive shield.

23. The power semiconductor device according to claim 21, further comprising a high-insulative passivation film for surface protection formed at least on an upper surface of said at least one conductive shield.

24. A power semiconductor device comprising:

an impurity substrate surface of low concentration having a first conductivity type formed in a predetermined region of a substrate surface;

an impurity region of high concentration having a second conductivity type formed in said substrate surface adjacent to said impurity substrate surface;

a conductor formed over said substrate surface to be insulated from said impurity substrate surface;

a conductive shield formed to include at least part of a region over said impurity substrate surface other than a region where said conductor is formed and to include a region overlapping a boundary region between said impurity substrate surface and said impurity region, said conductive shield being formed over, but not directly contacting, said impurity substrate surface and said impurity region with only a predetermined insulation film interposed between said conductive shield and said substrate surface, at least part of said conductive shield being connected to said conductor; and an electrode in contact with said conductive shield and comprised of a different compound than said conductive shield.

25. The power semiconductor device according to claim 24, further comprising:

a conductive element arranged in the vicinity of said conductive shield leaving a space therebetween and being electrically insulated from said conductive shield; and another shield formed in the vicinity of said conductive element to be connected to said conductive shield and to be electrically insulated from said conductive element, extending from said boundary region between said impurity substrate surface and said impurity region to said conductive shield.

26. The power semiconductor device according to claim 24, further comprising a high-insulative passivation film for surface protection formed at least on an upper surface of said at least one conductive shield.

* * * * *